United States Patent
Pei

(10) Patent No.: US 11,430,829 B2
(45) Date of Patent: Aug. 30, 2022

(54) DISPLAY PANEL HAVING REFLECTIVE LAYER AND SPACER LAYER

(71) Applicant: AU Optronics Corporation, Hsin-Chu (TW)

(72) Inventor: Kai Pei, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 203 days.

(21) Appl. No.: 16/795,649

(22) Filed: Feb. 20, 2020

(65) Prior Publication Data
US 2020/0365650 A1    Nov. 19, 2020

(30) Foreign Application Priority Data

May 17, 2019    (TW) ................................ 108117197

(51) Int. Cl.
*H01L 27/15*    (2006.01)
*H01L 33/50*    (2010.01)
*H01L 33/58*    (2010.01)
*H01L 33/60*    (2010.01)

(52) U.S. Cl.
CPC .......... *H01L 27/156* (2013.01); *H01L 33/507* (2013.01); *H01L 33/58* (2013.01); *H01L 33/60* (2013.01)

(58) Field of Classification Search
CPC ..... H01L 27/156; H01L 33/507; H01L 33/58; H01L 33/60; H01L 33/50; H01L 25/0753; H01L 27/3246; G09F 9/33
See application file for complete search history.

(56) References Cited

U.S. PATENT DOCUMENTS

| | | | |
|---|---|---|---|
| 8,841,677 B2* | 9/2014 | Jung | H01L 27/1288 257/59 |
| 10,304,813 B2* | 5/2019 | Kuo | H01L 25/0753 |
| 2011/0062859 A1 | 3/2011 | Kawamura | |
| 2017/0033164 A1* | 2/2017 | Liu | G02B 5/0808 |

FOREIGN PATENT DOCUMENTS

| | | |
|---|---|---|
| CN | 101960917 A | 1/2011 |
| CN | 106684108 A | 5/2017 |
| CN | 107331680 A | 11/2017 |
| CN | 109445638 A | 3/2019 |

* cited by examiner

*Primary Examiner* — Stephen M Bradley
(74) *Attorney, Agent, or Firm* — WPAT, PC

(57) ABSTRACT

A display panel includes a first substrate, a second substrate, at least one light-emitting diode, at least one reflective layer, and at least one first spacer layer. The first substrate has a filter layer. The second substrate is opposite to the first substrate. The light-emitting diode is disposed on the second substrate. The reflective layer is located on the first substrate and protrudes toward the second substrate. The first spacer layer is located between the first substrate and the second substrate. The first spacer layer has a first end and a second end, and the first end of the first spacer layer is located between a surface of the reflective layer adjacent to the second substrate and the second substrate.

12 Claims, 31 Drawing Sheets

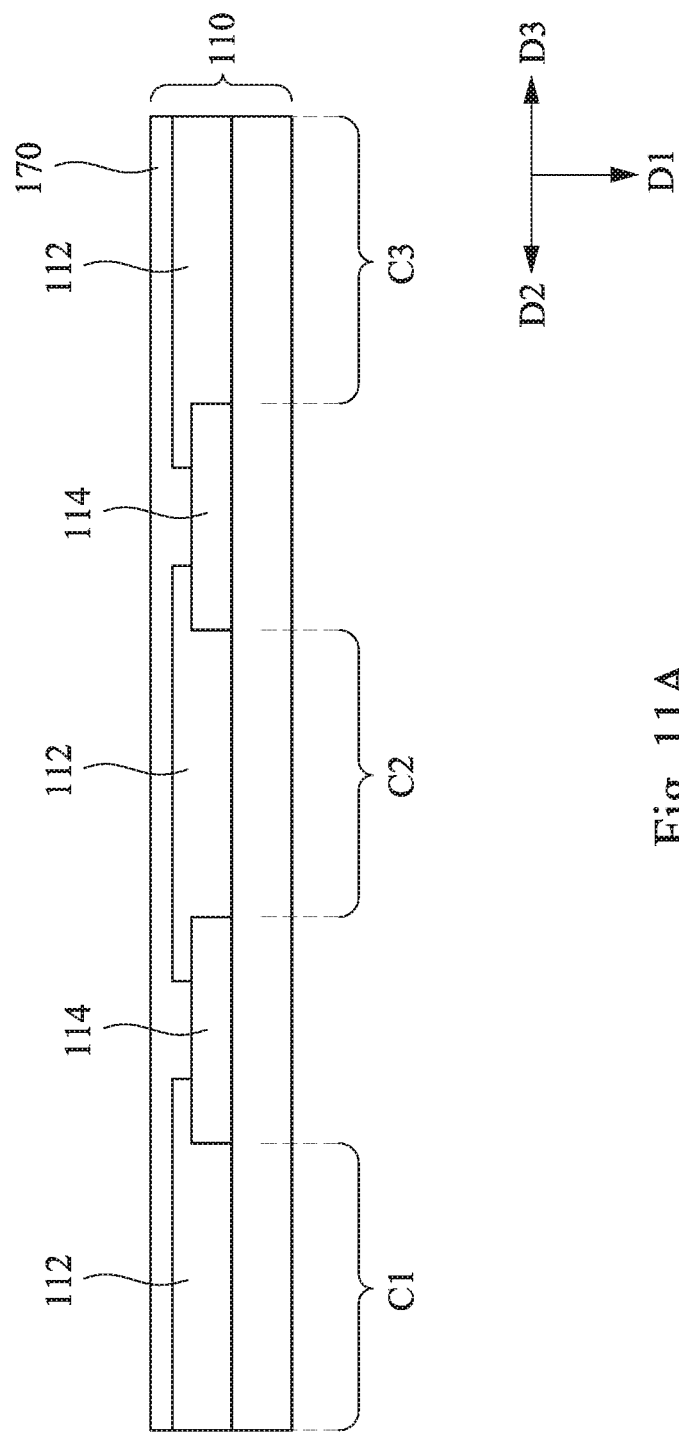

DISPLAY PANEL HAVING REFLECTIVE LAYER AND SPACER LAYER

RELATED APPLICATIONS

This application claims priority to Taiwan Application Serial Number 108117197, filed May 17, 2019, which is herein incorporated by reference.

BACKGROUND

Technical Field

The present disclosure relates to a display panel.

Description of Related Art

Nowadays, the light-emitting diode array display panel required thicker black matrix or multilayer black matrix layers to reduce the color mixing problem of the conversed light between different sub-pixels. However, the light absorbing property of the black matrix layer may degrade the light conversion efficiency of the display panel. Furthermore, it is difficult to reduce width of the multiple-layer light shielding structures between sub-pixels, which is unfavorable for minimization and improvement of resolution of the display panel.

SUMMARY

One aspect of the present disclosure is a display panel.

According to some embodiments of the present disclosure, a display panel includes a first substrate, a second substrate, at least one light-emitting diode, at least one reflective layer, and at least one first spacer layer. The first substrate has a filter layer. The second substrate is opposite to the first substrate. The light-emitting diode is disposed on the second substrate. The reflective layer is located on the first substrate and protrudes toward the second substrate. The first spacer layer is located between the first substrate and the second substrate. The first spacer layer has a first end and a second end, and the first end of the first spacer layer is located between a surface of the reflective layer adjacent to the second substrate and the second substrate.

In some embodiments, an edge of the first end of the first spacer layer is substantially aligned with an edge of the reflective layer adjacent to the first end along a direction perpendicular to the first substrate.

In some embodiments, an edge of the second end of the first spacer layer is substantially aligned with an edge of the reflective layer adjacent to the second end along a direction perpendicular to the first substrate.

In some embodiments, a material of the reflective layer includes metal, the reflective layer has a first section, a second section, and a third section connected with the first section and the second section, the second section is located between the first spacer layer and the first substrate, the third section is in contact with a sidewall of the first spacer layer, and the first end of the first spacer layer covers the first section.

In some embodiments, a second spacer layer is located on the first substrate and protrudes toward the second substrate, the third section of the reflective layer is in contact with a sidewall of the second spacer layer, and the first section of the reflective layer is located between the first spacer layer and the second spacer layer.

In some embodiments, the first substrate further includes a protection film covering the filter layer, and a material of the protection film includes transparent conductive layer.

In some embodiments, the first substrate further includes a black matrix, and a projection of the reflective layer on the first substrate is within a projection of the black matrix on the first substrate.

In some embodiments, the display panel further includes a color conversion layer located between the filter layer and the light-emitting diode.

In some embodiments, a material of the reflective layer includes metal, and the display panel further includes a protection layer located between the color conversion layer and the reflective layer.

In some embodiments, the reflective layer has two first sections, a second section, and two third sections respectively connected with the second section and the first sections, the second section is located between the first spacer layer and the first substrate, the two first sections are located between the first spacer layer and the color conversion layer, and the two third sections are respectively in contact with two opposite side walls of the first spacer layer.

In some embodiments, the light-emitting diode and the filter layer have the same color.

In some embodiments, the display panel further includes a plurality of color regions, when viewed from a direction along the arrangement of the color regions, a number of the at least one first spacer layer is plural, a number of the at least one reflective layer is plural, and adjacent two of the first spacer layers are located between adjacent two of the reflective layers.

In some embodiments, a color conversion layer is located between the two first spacer layers.

In some embodiments, the first spacer layer includes a light-absorbing photoresist material.

In some embodiments, the reflective layer includes a light-reflecting photoresist material.

In some embodiments, the display panel further includes a plurality of light-emitting diodes respectively correspond to a first color region, a second color region, and a third color region, and the first color region further includes a color conversion layer located between the first substrate and the second substrate, and the color conversion layer is overlapped with the filter layer along a direction substantially perpendicular to the first substrate.

In some embodiments, the second color region and the third color region further include a second spacer layer disposed between the first substrate and the light-emitting diodes.

In some embodiments, the light-emitting diodes correspond to the second color region and the third color region respectively emit blue light and green light, and the filter layer of the first color region has red color.

Another aspect of the present disclosure is a display panel.

In some embodiments, a display panel includes a first substrate, a second substrate, a light-emitting diode, a white insulation layer, and a first spacer layer. The first substrate has a filter layer and a black matrix. The second substrate is opposite to the first substrate. The light-emitting diode is disposed on the second substrate. The white insulation layer is located on the second substrate and protrudes toward the first substrate, and the white insulation layer is overlapped with the filter layer and the black matrix along a direction substantially perpendicular to the first substrate. The first spacer layer is disposed between the second substrate and the white insulation layer, and the first spacer layer is overlapped with the black matrix along the direction.

In some embodiments, the white insulation layer includes a light-reflecting photoresist material, and the first spacer layer includes a light-absorbing photoresist material.

According to the foregoing embodiments, by depositing the reflective layer between the first spacer layer and the second spacer layer, or adjacently depositing the reflective layer and the first spacer layer, or making the white insulation layer and the first spacer layer free from overlapping along the direction of arrangement of the sub-pixels, the width of the light shielding structure formed by these mentioned structures along the second direction D2 can be reduced. Therefore, the interval between adjacent two sub-pixels may be reduced such that the number of the pixels can be increased and the resolution of the display panel can be increased.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows:

FIGS. 11A to 11G are cross-sectional views of the display panel in FIG. 9 at different stages of the fabrication method in FIG. 10;

DETAILED DESCRIPTION

Figure 1:
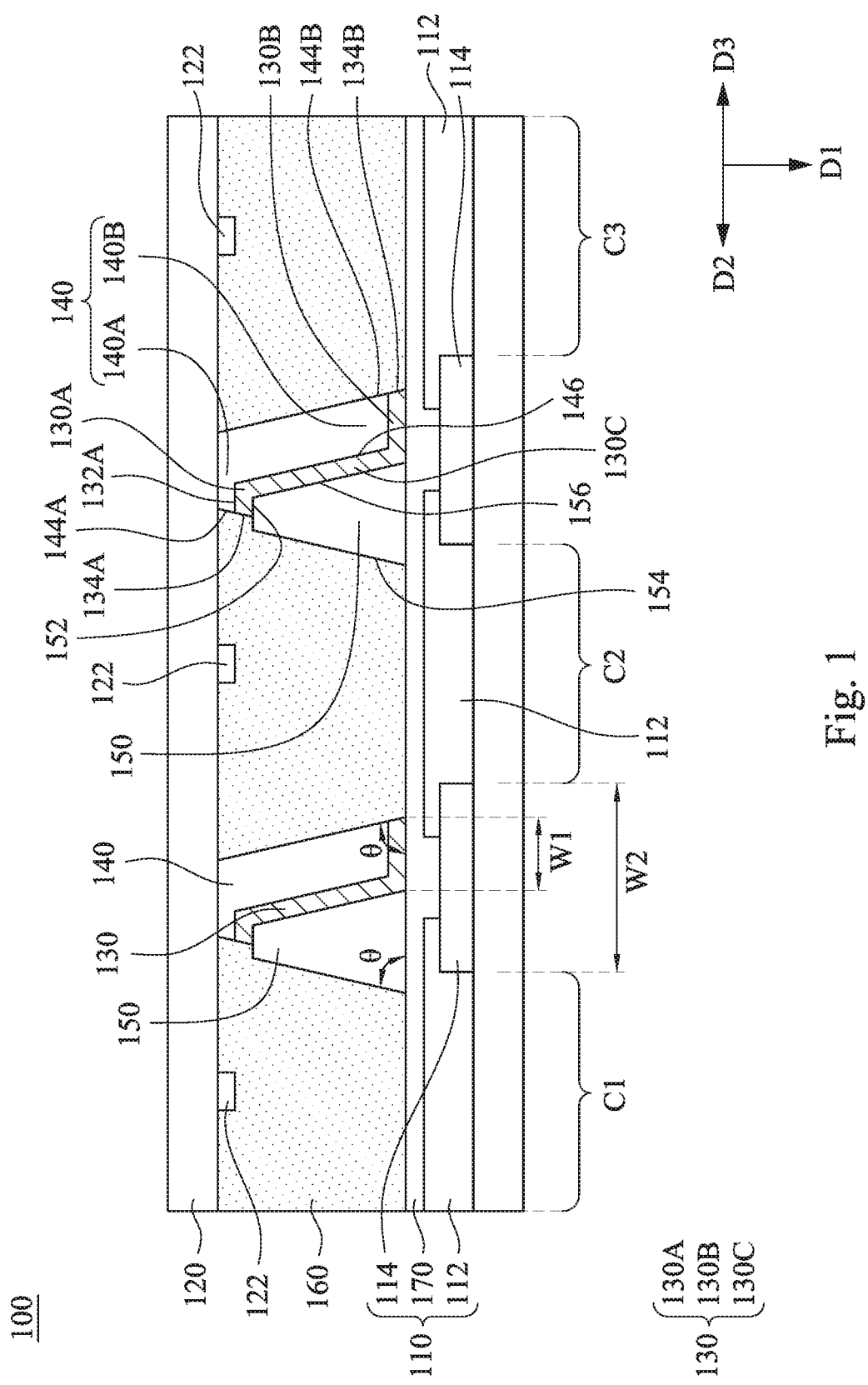
FIG. 1 is a cross-sectional view of a display panel according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a cross-sectional view of a display panel 100 according to one embodiment of the present disclosure. The display panel 100 includes a first substrate 110, a second substrate 120, a reflective layer 130, and a first spacer layer 140, and a light-emitting diode 122. The second substrate 120 is opposite to the first substrate 110, and the first substrate 110 and the second substrate 120 are arranged along a first direction D1. The first direction D1 herein means the direction perpendicular to the first substrate 110 and the second substrate 120. The first substrate 110 has a filter layer 112, the light-emitting diode 130 is disposed on the second substrate 120, and the filter layer 112 and the light-emitting diode 122 are overlapped along the first direction D1. The reflective layer 130 is located on the first substrate 110 and protrudes toward the second substrate 120. The first spacer layer 140 is located between the first substrate 110 and the second substrate 120, and the first spacer layer 140 has a first end 140A and a second end 140B.

In the present embodiment, the first spacer layer 140 includes transparent insulation material. The first end 140A is a section of the first spacer layer 140 adjacent to the second substrate 120, and the second end 140B is a section of the first spacer layer 140 adjacent to the first substrate 110. The first end 140A of the first spacer layer 140 is located at a surface 132A of the reflective layer 130 adjacent to the second substrate 120 and the second substrate 120. In other words, the second substrate 120, the first end 140A of the first spacer layer 140, and the reflective layer 130 are substantially stacked along the first direction D1, and the reflective layer 130 and the second substrate 120 are separated by the first spacer layer 140.

In the present embodiment, a material of the reflective layer 130 includes metal, and the reflective layer 130 has a first section 130A, a second section 130B, and a third section 130C connected with the first section 130A and the second section 130B. The second section 130B is located between the first spacer layer 140 and the first substrate 110, the third section 130C is in contact with a sidewall 146 of the first spacer layer 140, and the first end 140A of the first spacer layer 140 covers the first section 130A. In addition, the first section 130A and the second section 130B reversely extend from two opposite ends from the third section 130C, respectively. Specifically, in the present embodiment, the first section 130A and the second section 130B respectively extend along a second direction D2 and a third direction D3 perpendicular to the first direction D1, but the present disclosure is not limited in this regard. The second direction D2 and the third direction D3 represent the direction of arrangement of sub-pixels. In some embodiments, the first section 130A and the second section 130B may respectively extend along the third direction D3 and the second direction D2.

In the present embodiment, an edge 144A of the first end 140A of the first spacer layer 140 is substantially aligned with an edge 134A of the reflective layer 130 adjacent to the first end 140A along the first direction D1 perpendicular to the first substrate 110. An edge 144B of the second end 140B of the first spacer layer 140 is substantially aligned with an edge 134B of the reflective layer 130 adjacent to the second end 140B along the first direction D1. In other words, the edge 144A of the first end 140A of the first spacer layer 140 are substantially aligned with the edge 134A of the first section 130A of the reflective layer 130 along the first direction D1 and collectively form an incline. The edge 144B of the second end 140B of the first spacer layer 140 are substantially aligned with the edge 134B of the second section 130B of the reflective layer 130 along the first direction D1 and collectively form an incline.

In the present embodiment, the display panel 100 further includes a second spacer layer 150 located on the first substrate 110 and protrudes toward the second substrate 120. The second spacer layer 150 and the first spacer layer 140 have the same transparent insulation material. The third section 130C of the reflective layer 130 is in contact with a sidewall 156 of the second spacer layer 150, and the first section 130A of the reflective layer 130 is located between the first spacer layer 140 and the second spacer layer 150. In other words, the second substrate 120, the first end 140A of the first spacer layer 140, the first section 130A of the reflective layer 130, and the second spacer layer 150 are sequentially stacked along the first direction D1. In the present embodiment, an upper surface 152 of the second spacer layer 150 adjacent to the second substrate is in contact with the first section 130A of the reflective layer 130. A location where the first end 140A of the first spacer layer 140 ad the first section 130A of the reflective layer 130 are aligned can be arbitrary location above the upper surface 152 of the second spacer layer 150. That is, the first end 140A of the first spacer layer 140 and the first section 130A of the reflective layer 130 may completely cover the upper surface 152 of the second spacer layer 150, or partially cover the upper surface 152 of the second spacer layer 150, or not cover the upper surface 152 of the second spacer layer 150, but the merely cover the side wall 15 of the second spacer layer 150. Specifically, the first section 130A of the reflective layer 130 does not cover another side wall 154 of the second spacer layer 150 away from the first spacer layer 140. That is, the first spacer layer 140, the reflective layer 130, and the second spacer layer 150 are not stacked repeatedly along the second direction D2 (or the third direction D3).

In some embodiments, the first substrate and the light-shielding structure that is formed by the reflective layer 130, the first spacer layer 140, and the second spacer layer 150 have an inclined angle θ therebetween, which is in a range from about 60 degree to about 90 degree, but the present disclosure is not limited in this regard. Specifically, as shown in FIG. 1, the first substrate 110 and the incline formed by the alignment between the edge 144B of the second end 140B of the first spacer layer 140 and the edge 134B of the second section 130B of the reflective layer 130 have the inclined angle θ. Similarly, the first substrate 110 and another side wall 154 of the second spacer layer 150 away from the first spacer layer 140 have the inclined angle θ therebetween. In one proper embodiment, the inclined angle θ is in a range from about 70 degree to about 80 degree, such that the third section 130C of the reflective layer 130 may cover the side wall 156 of the second spacer layer 150 more completely, and the light shielding structure may have a better reflecting ability.

It is noted that, the reflective layer 130, the first spacer layer 140, and the second spacer layer 150 shown in FIG. 1 are continuous pattern surrounding multiple sub-pixels along the first direction D1. However, to describe clearly, along the second direction D2 (third direction D3) that the sub-pixels are arranged, portions of the first spacer layer 140, the second spacer layer 150, and the reflective layer 130 located at two opposite sides of arbitrary sub-pixel are considered as two individual units.

The display panel 100 further includes a color conversion layer 160. The color conversion layer 160 is located between the first substrate 110 and the second substrate 120, that is, the filter layer 112 and the light-emitting diode 122. Specifically, portions of the color conversion layer 160 in each of the sub-pixels are collectively surrounded by the reflective layer 130, the first spacer layer 140, and the second spacer layer 150. In other words, the edges 144A, 144B of the first spacer layer, the edges 134A, 134B of the reflective layer 130, and the side wall 154 of the second spacer layer 150 away from the first spacer layer 140 are in contact with the color conversion layer 160. In addition, an upper surface 152 of a portion of the second spacer layer 150 that is not covered by the reflective layer is in contact with the color conversion layer 160. The color conversion layer 160 includes phosphorus powder or phosphorus dye, such that a portion of the light from the light-emitting diode 122 is transformed as a light with different wavelength.

As shown in FIG. 1, the display panel 100 includes a first color region C1, a second color region C2, and a third color region C3 respectively represent the light outlet regions of each sub-pixel. For example, with the second color region C2 as an example, a portion of the light from the light-emitting diode 122 may transfer straight and pass the color filter 112 of the second color region C2, and another portion of the light may be transformed by the color conversion layer 160 to another light which transfers toward all directions. A portion of the light transformed by the color conversion layer 160 pass the second spacer layer 150 and be reflected by the reflective layer 130 toward the first substrate 110. Therefore, the light from the light-emitting diode 122 mix with the light that is transformed and passes toward the first substrate 110, and the wavelength of the light that pass the filter layer 112 and then pass the first substrate 110 in the second color region C2 corresponds to the color of each sub-pixel. In the present embodiment, light-emitting diode 122 may be blue light or green light, the filter layer 112 may be blue color, green color, or red color. The sight of the second direction D2 or the third direction D3 in FIG. 1 is the direction of arrangement of color regions (or sub-pixels). That is, when viewed from the direction of arrangement of color regions, the second spacer layer 150, and the reflective layer 130 located at two opposite sides of each color regions are considered as two individual units.

Accordingly, by depositing reflective layer 130 between the first spacer layer 140 and the second spacer layer 150, a width along the second direction D2 (or the third direction D3) of the light shielding structure formed by the reflective layer 130, the first spacer layer 140, and the second spacer layer 150 may be reduced. As such, and interval between adjacent two sub-pixels may be reduced such that the number of the pixels can be increased and the resolution of the display panel 100 can be increased.

In addition, since the light from the light-emitting diode 122 that is transformed by the color conversion layer 160 transfer toward all directions, and a portion of the light that pass toward the reflective layer 130 can pass the first color region C1, the second color region C2, and the third color region C3 of the first substrate 110 after being reflected by the reflective layer 130. Therefore, light emitting efficiency of the display panel 100 can be increased by depositing the reflective layer 130.

The first substrate 100 further includes a black matrix 114 and a protection film 170. The black matrix 114 is located between adjacent two of the filter layers 112. The protection film 170 covers the filter layer 112 and the black matrix 114. The protection film 170 may be insulation layer or transparent conductive layer (e.g., Indium Tin Oxide, ITO). The protection film 170 is configured to protect the filter layer 112 and the black matrix 114 of the first substrate 110 in the process of forming the first spacer layer 140, the second spacer layer 150, and the reflective layer 130. Similarly, the black matrix 114 is a continuous pattern surrounding multiple sub-pixels along the first direction D1. In addition, when the protection film 170 is a transparent conductive layer, the protection film 170 may not only protection the filter layer 112 and the black matrix 114 but also shield electromagnetic interference so as to improve the display quality of the display panel 100.

In the present embodiment, a projection of the reflective layer 130 on the first substrate 110 is within a projection of the black matrix 114 on the first substrate 110. In other words, the projection of the reflective layer 130 on the first substrate 110 is smaller or equal to the projection of the black matrix 114 on the first substrate 110. As such, the mixed light of the light from the light-emitting diode 122 and another transformed light which passes toward the first substrate 110 can be prevented from leaking between two color regions. Furthermore, since the second section 130B of the reflective layer 130 is adjacent to the first substrate 110, the black matrix 114 has to cover at least the second section 130B of the reflective layer 130. In other words, the projection of the black matrix 114 on the first substrate 110 may cover the projection of the second section 130B of the reflective layer 130 on the first substrate 110. As shown in FIG. 1, the second section 130B of the reflective layer 130 has a width W1 along the second direction D2, the black matrix 114 has a width W2 along the second direction D2, and the width W1 is smaller or equal to the width W2. As such, another light reflected by the second section 130B of the reflective layer 130 can be prevented from leaking between two color regions.

Figure 2:
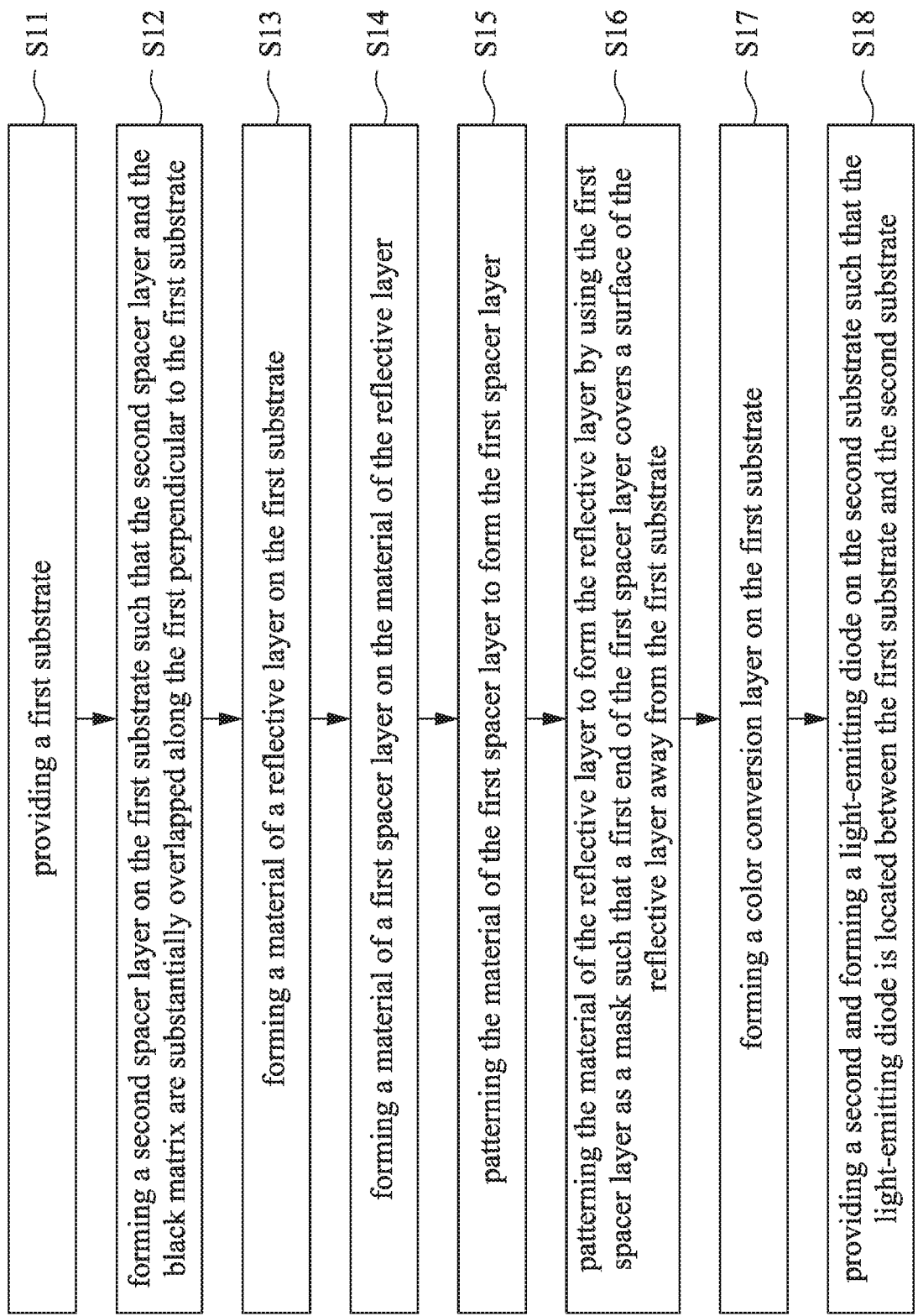
FIG. 2 is a flow chart of a fabrication method of the display panel in FIG. 1.
Figure 3A:
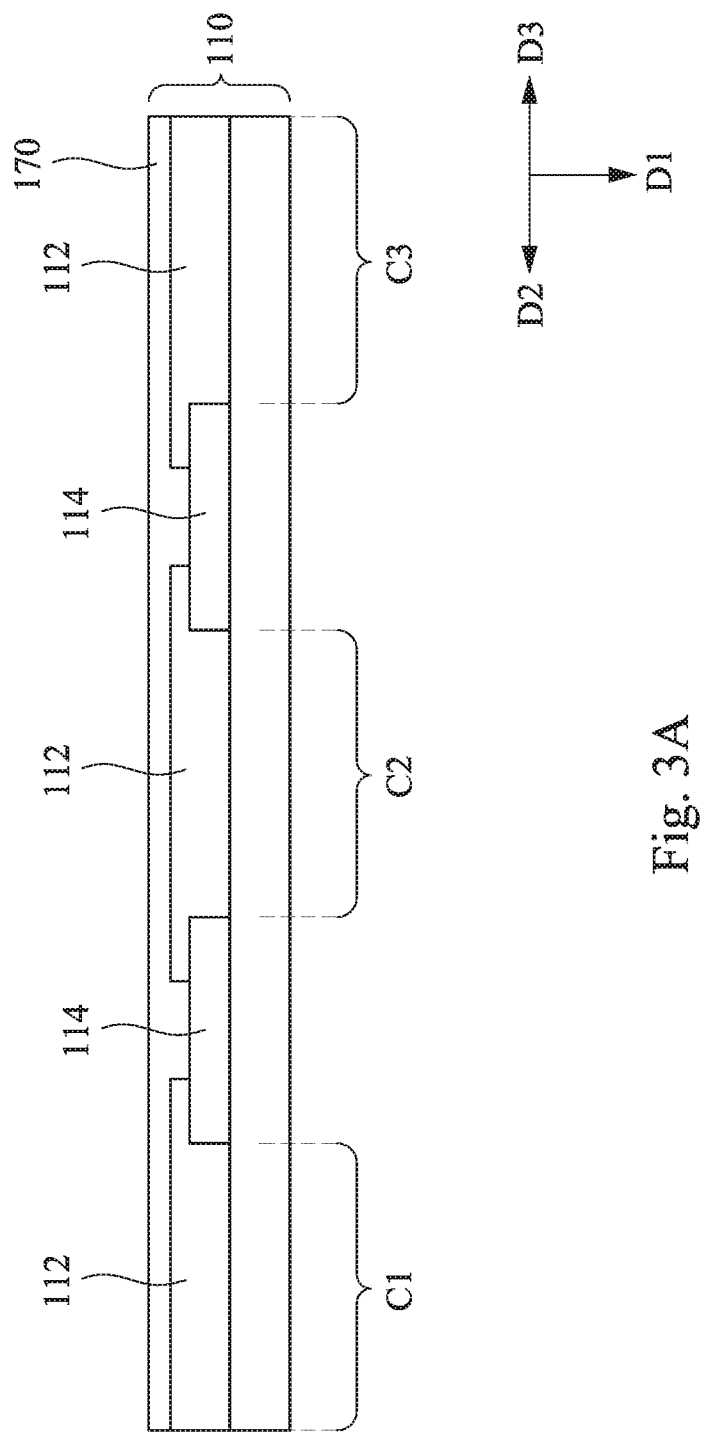
FIGS. 3A to 3H are cross-sectional views of the display panel at different stages of the fabrication method of FIG. 2.

FIG. 2 is a flow chart of a fabrication method of the display panel 100 in FIG. 1. FIGS. 3A to 3H are cross-sectional views of the display panel 100 at different stages of the fabrication method of FIG. 2. Reference is made to FIG. 2 and FIG. 3A, in step S11, providing a first substrate 110. The first substrate 110 includes a filter layer 112, a black matrix 114, and a protection film 170. The protection film 170 covers the black matrix 114 and the filter layer 112 so as to protect the filter layer 112 and the black matrix 114 in the subsequent processes.

Figure 3B:
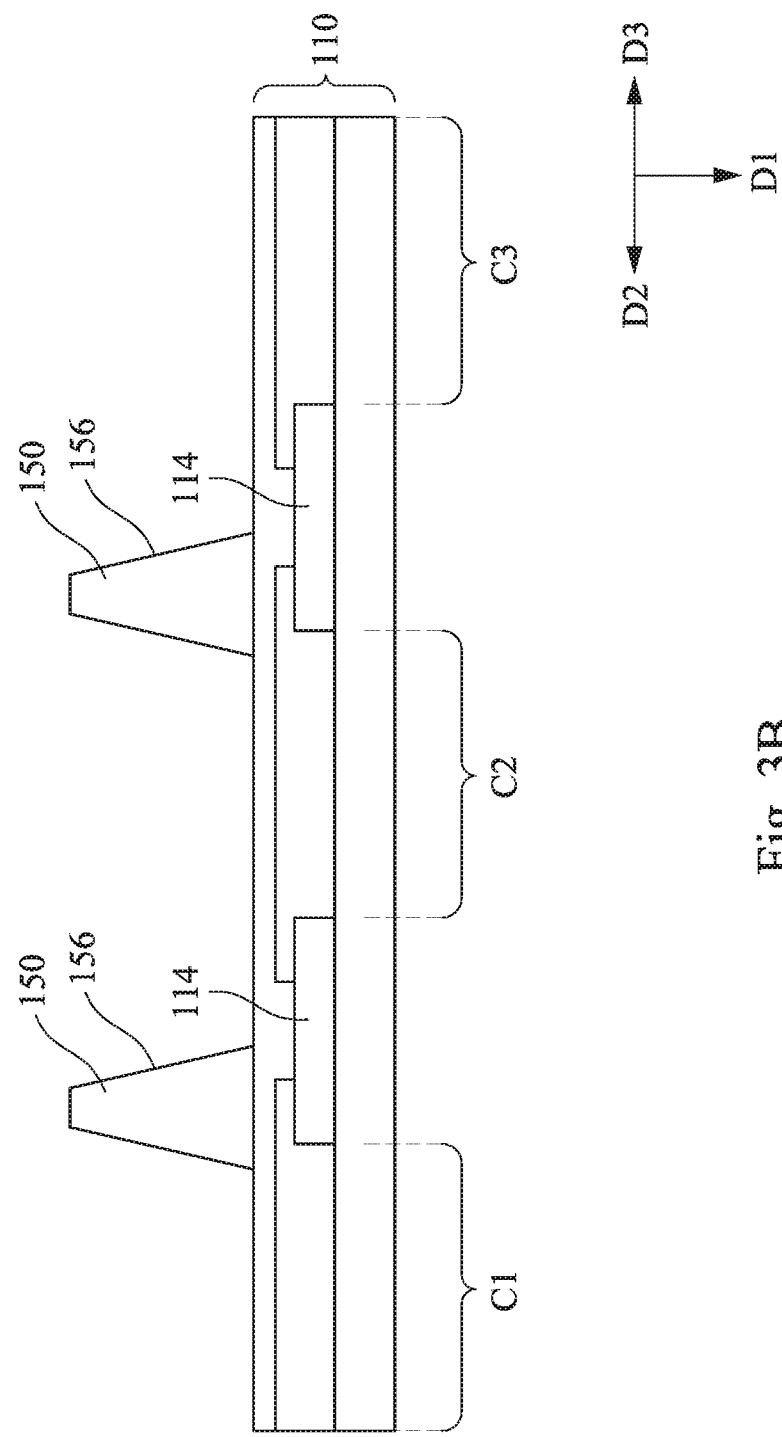

Reference is made to FIG. 2 and FIG. 3B, in step S12, forming a second spacer layer 150 on the first substrate 110. In the present embodiment, first forming a material of the second spacer layer to cover the first substrate 110, and pattern the material of the second spacer layer to form the second spacer layer 150 by photolithography such that the second spacer layer 150 and the black matrix 114 are substantially overlapped along the first direction D1 perpendicular to the first substrate 110. In some embodiments, the second spacer layer 150 is formed by printing. Specifically, the second spacer layer 150 and the black matrix 114 are partially overlapped along the first direction D1, and the centers of the second spacer layer 150 and the black matrix 114 are not aligned. For example, in the present embodiment, a side wall 156 of the second spacer layer 150 is substantially close to a center of the black matrix 114, and the second spacer layer 150 and a left portion of the black matrix 114 are overlapped along the first direction D1, but the present disclosure is not limited in this regard.

Figure 3C:
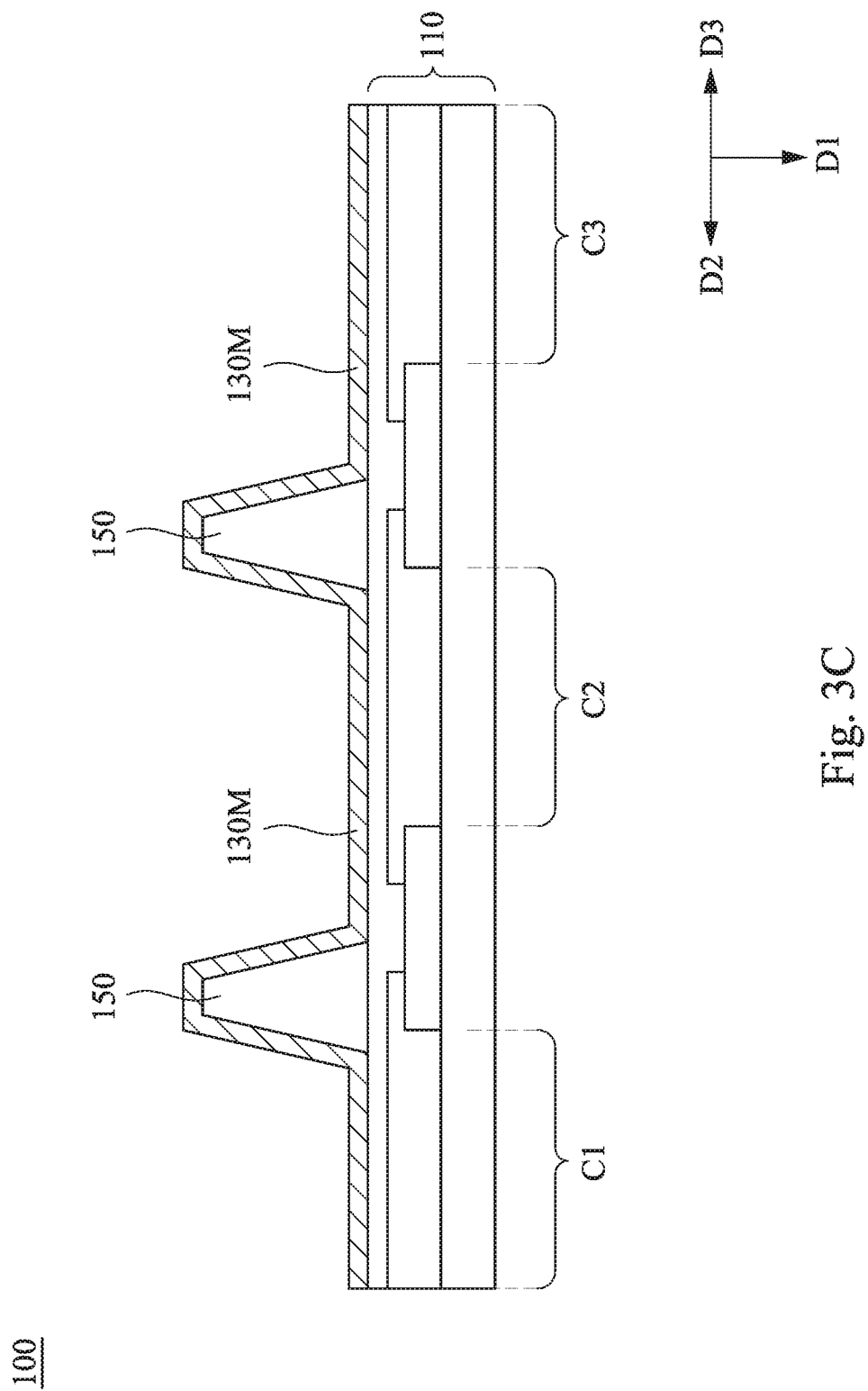

Reference is made to FIG. 2 and FIG. 3C, in step S13, forming a material of a reflective layer 130M on the first substrate 110. In the present embodiment, the material of the reflective layer 130M is metal. The material of the reflective layer 130M blanketly covers the second spacer layer 150 and the first substrate 110.

Figure 3D:
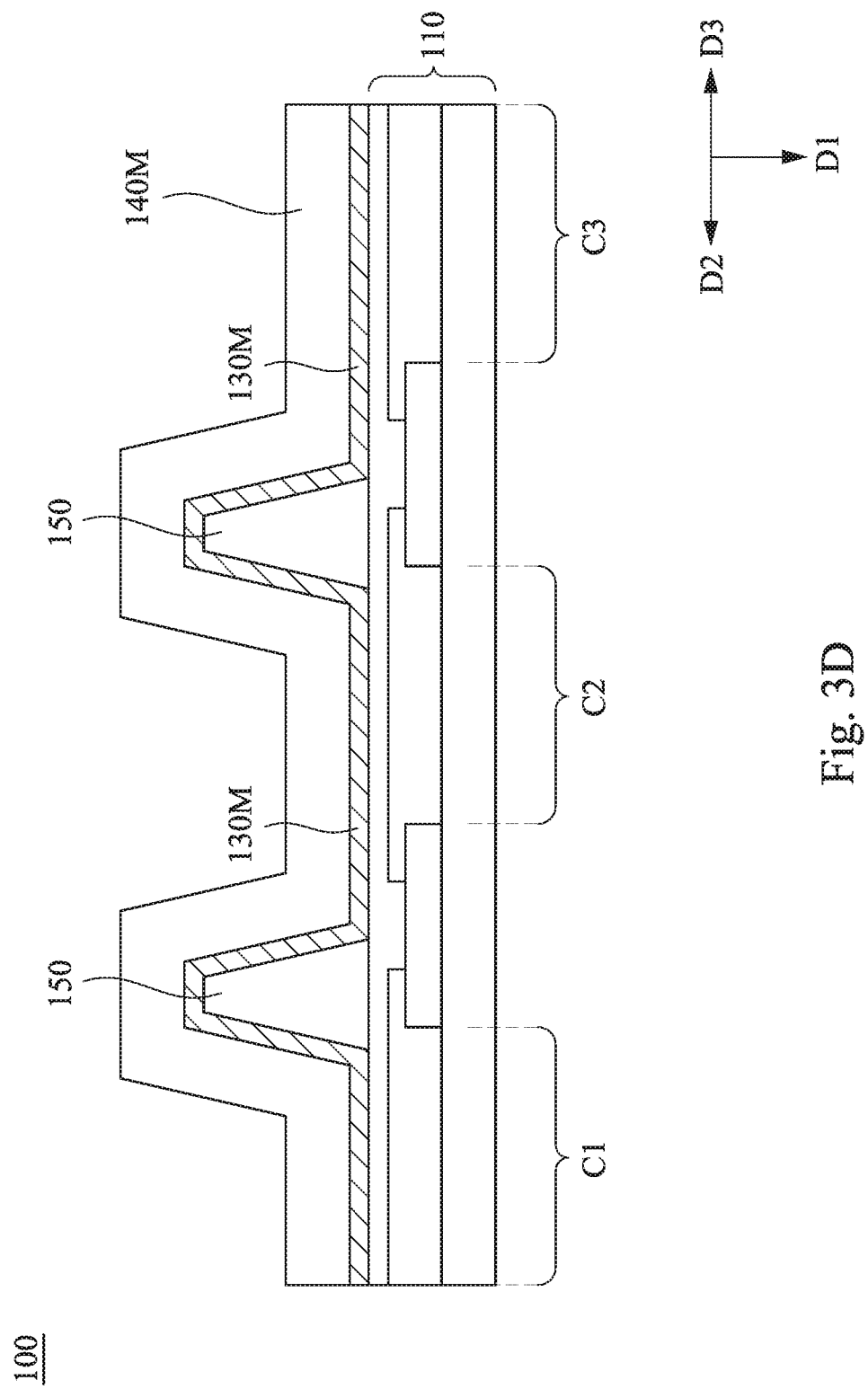

Reference is made to FIG. 2 and FIG. 3D, in step S14, forming a material of a first spacer layer 140M on the material of the reflective layer 130M.

Figure 3E:
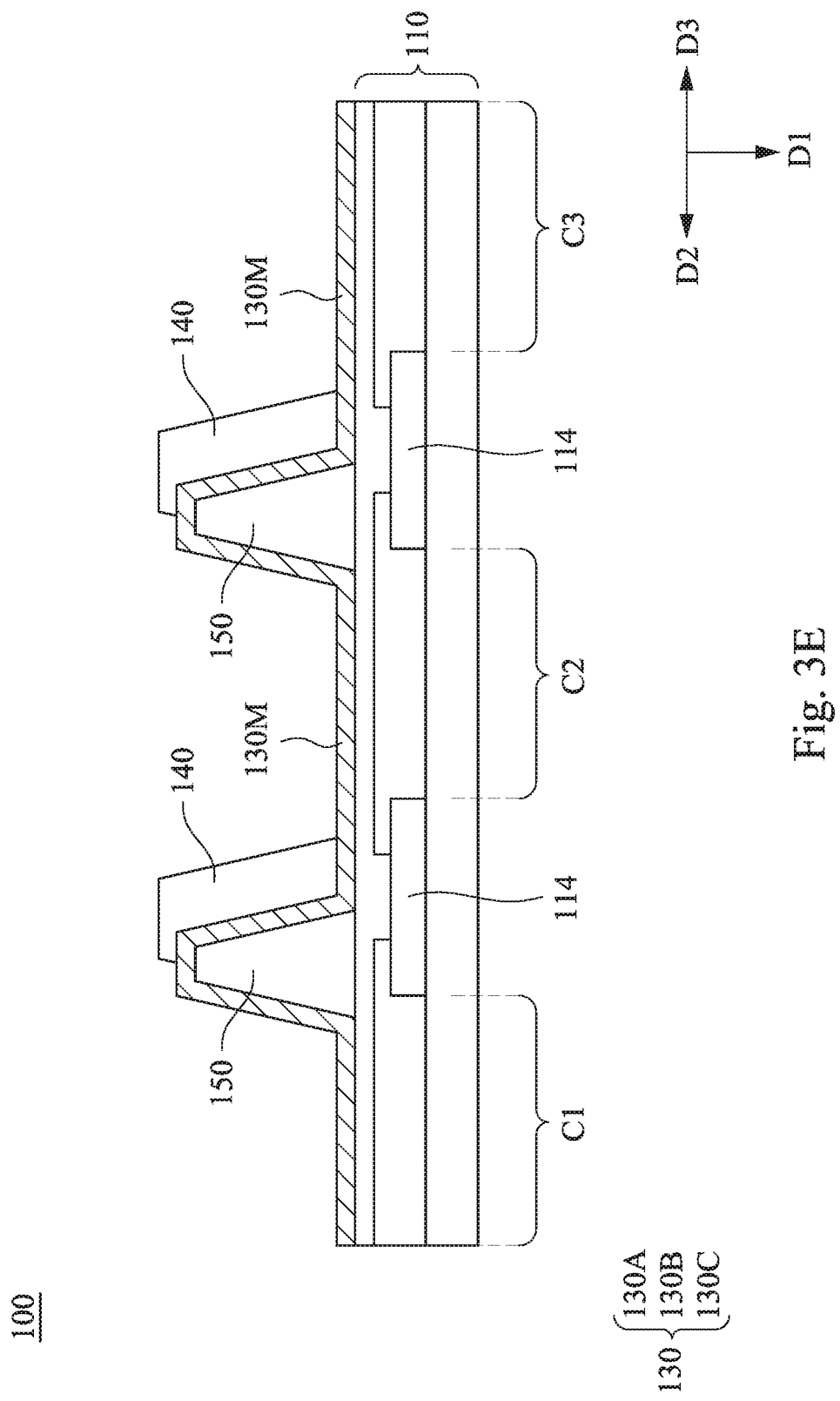

Reference is made to FIG. 2, FIG. 3D, and FIG. 3E, in step S15, patterning the material of the first spacer layer 140M to form the first spacer layer 140. As shown in FIG. 3E, a portion of the material of the reflective layer 130M is covered by the first spacer layer 140, and another portion of the material of the reflective layer 130M is exposed form the first spacer layer 140. Specifically, a projection of the portion of the material of the reflective layer 130M covered by the first spacer layer 140 on the first substrate 110 is within a projection of the black matrix 114 on the first substrate 110. In other words, the projection of the first spacer layer 140 on the first substrate 110 is within the projection of the black matrix 114 on the first substrate 110.

Figure 3F:
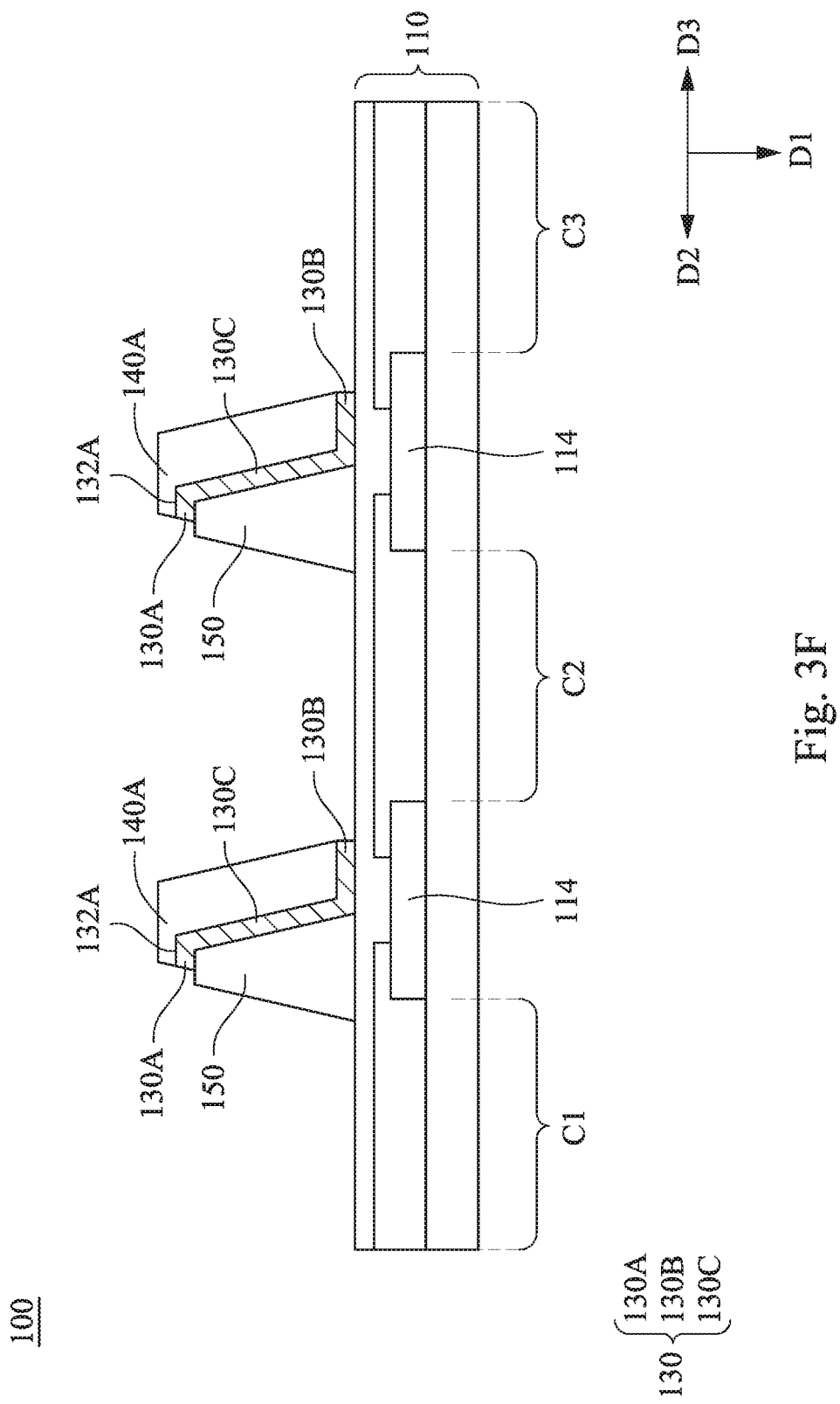

Reference is made to FIG. 2, FIG. 3E, and FIG. 3F, in step S16, patterning the material of the reflective layer 130M to form the reflective layer 130 by using the first spacer layer 140 as a mask. As shown in FIG. 3F, the portion of the material of the reflective layer 130M which is not covered by the first spacer layer 140 is removed such that a first end 140A of the first spacer layer 140 covers a surface 132A of the reflective layer 130 away from the first substrate 110, and a second section 130B of the reflective layer 130 and the right portion of the black matrix 114 are overlapped along the first direction D1. Accordingly, the position of the second section 130B and the third section 130C of the reflective layer 130 are determined by the second spacer layer, and the first section 130A and an extension length of the second section 130B of the reflective layer 130 are determined by the first spacer layer 140. Through the aforementioned steps, the first spacer layer 140, the reflective layer 130, and the second spacer layer 150 are not stacked repeatedly along the second direction D2 (or the third direction D3) such that a width along the second direction D2 of the light shielding structure formed by the first spacer layer 140, the reflective layer 130, and the second spacer layer 150 may be reduced.

Figure 3G:
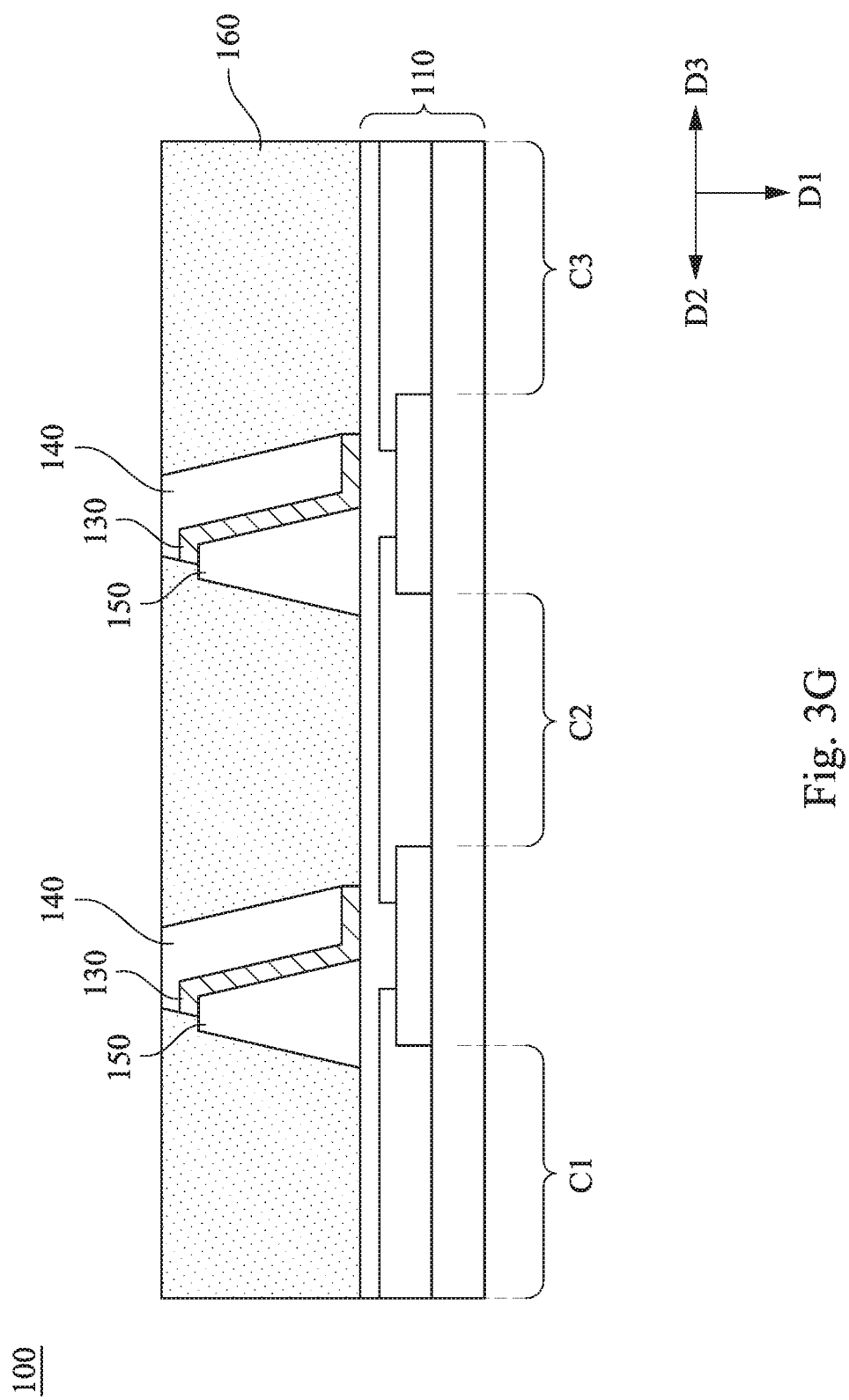

Reference is made to FIG. 2 and FIG. 3G, in step S17, after forming the reflective layer 130, forming a color conversion layer 160 on the first substrate 110. The color conversion layer 160 may be formed by injection method or polishing after spray so as to fill the first color region C1, the second color region C2, and the third color region C3.

Figure 3H:
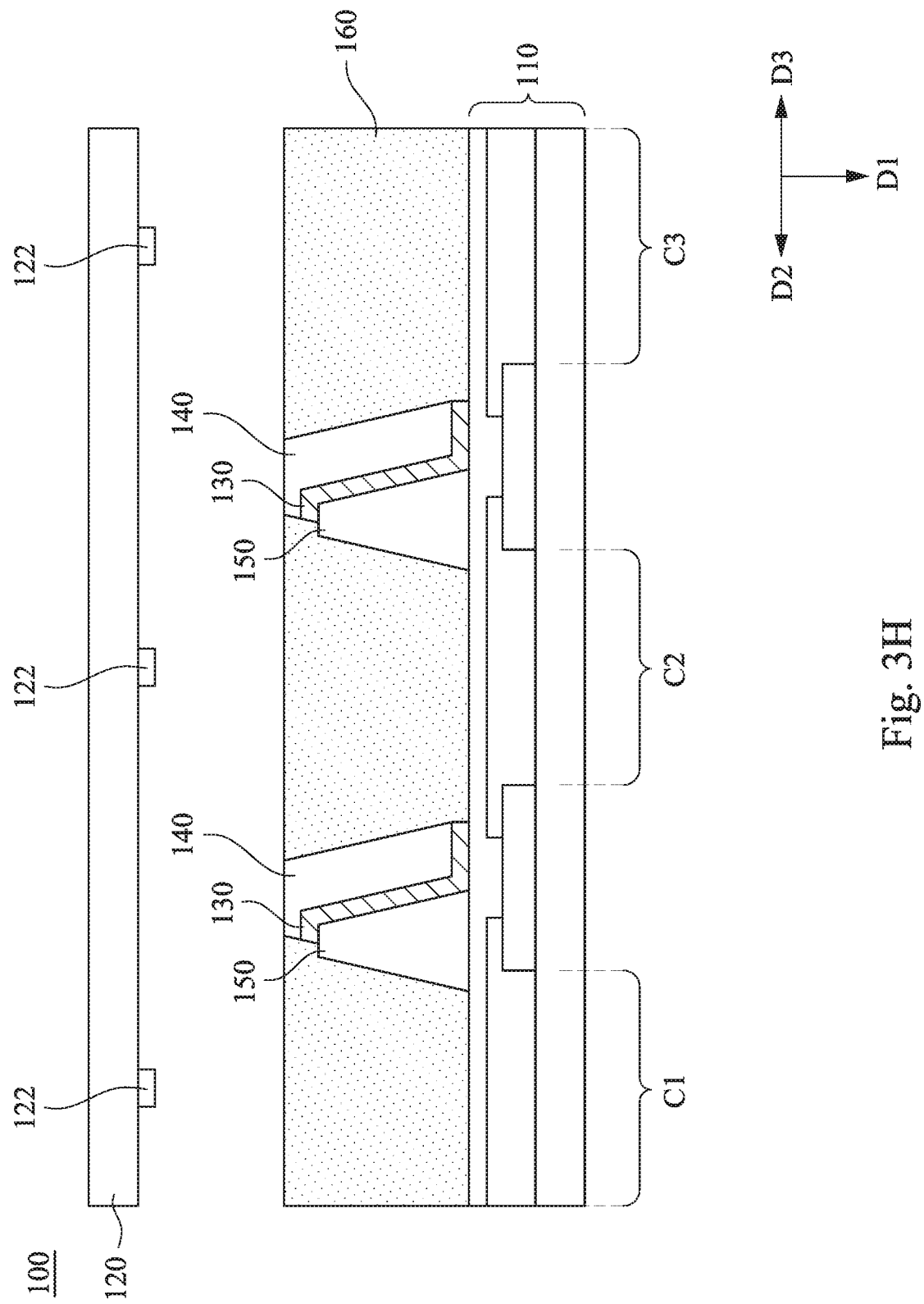

Reference is made to FIG. 2 and FIG. 3H, in step S18, providing a second substrate 120 and forming a light-emitting diode 122 on the second substrate 120 such that the light-emitting diode 122 is located between the first substrate 110 and the second substrate 120. As such, the display panel 100 as shown in FIG. 1 can be prepared.

Figure 4:
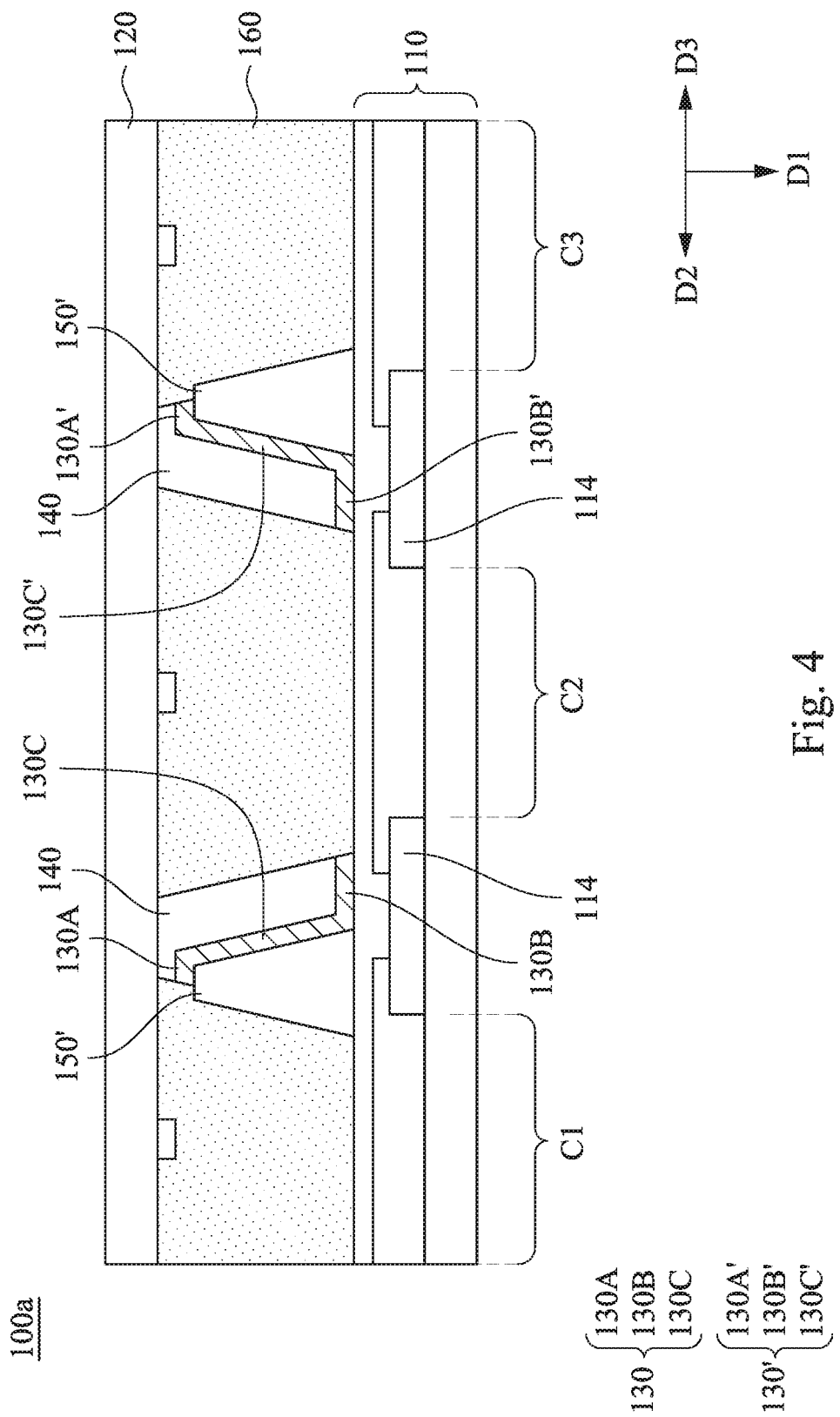
FIGS. 4 to 8 are cross-sectional views of display panels according to some embodiments of the present disclosure.

FIG. 4 is a cross-sectional view of the display panel 100a according to some embodiments of the present disclosure. The display panel 100a is similar to the display panel 100 in FIG. 1, the difference is that the first section 130A' of the reflective layer 130' extends toward the third direction D3, the second section 130B' of the reflective layer 130' extends toward the second direction D2. In other words, with the second color region C2 as an example, the reflective layers 130, 130' at opposite two sides, the first spacer layer 140, and the second spacer layer 150 are in mirror symmetry manner relative to the second color region C2.

In addition, since the projection of the black matrix 114 on the first substrate 110 covers the projection of the second section 130B' of the reflective layer 130' on the first substrate 110. Therefore, in the present embodiment, the second spacer layer 150' and the right portion of the black matrix 114 are overlapped along the first direction D1, and the second section 130B' of the reflective layer 130' and the left portion of the black matrix 114 are overlapped along the first direction D1. The display panel 100a has similar advantage as the display panel 100 in FIG. 1, the description is not repeated hereinafter.

Figure 5:
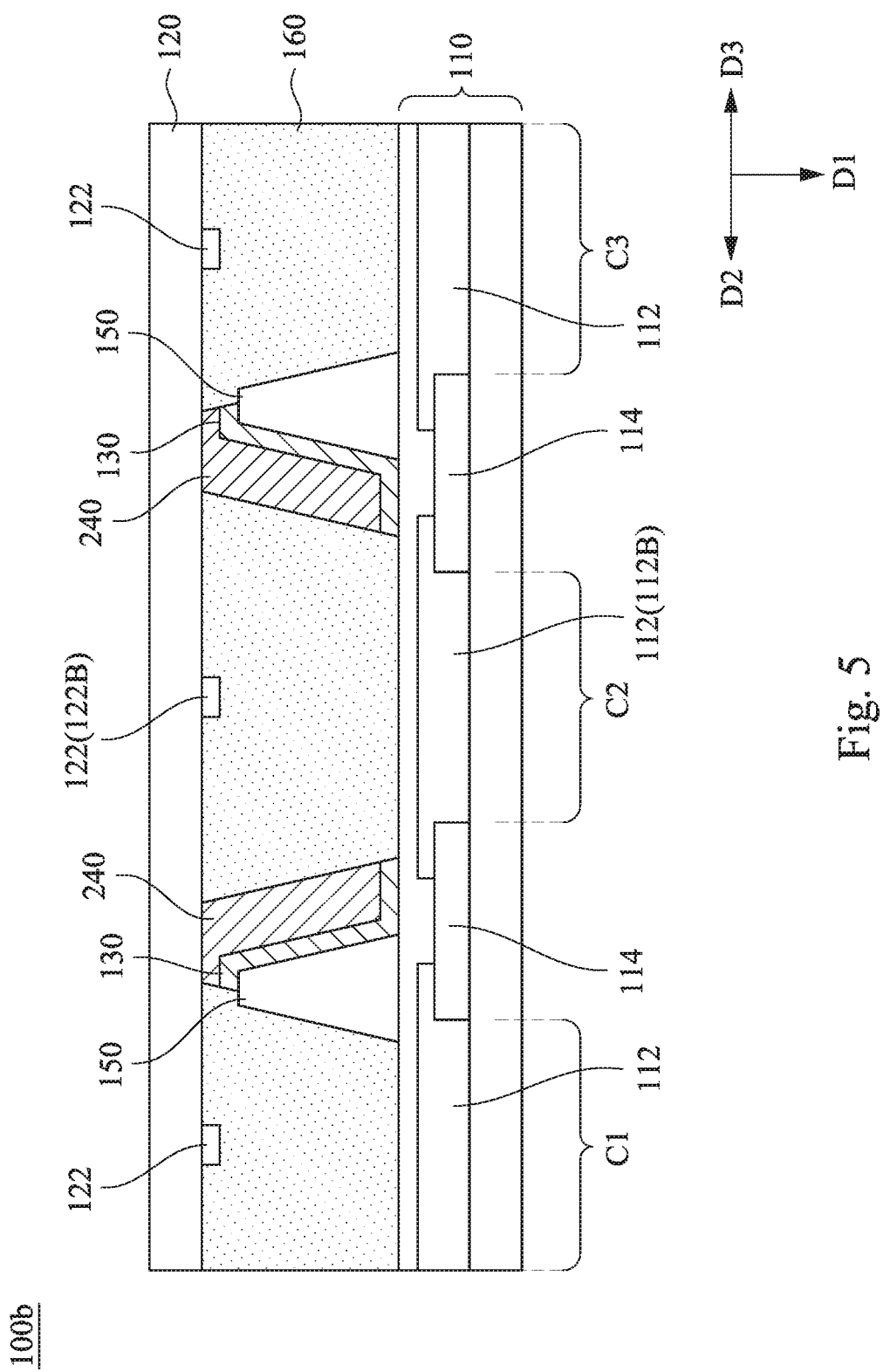

FIG. 5 is a cross-sectional view of the display panel 100b according to some embodiments of the present disclosure. The display panel 100b is similar to the display panel 100a in FIG. 4, the difference is that the first spacer layer 240 includes light-absorbing photoresist material, and the filter layer 112B and the light-emitting diode 122B in the second color region C2 have the same color. The light-absorbing photoresist material may be organic material or inorganic material, the present disclosure is not limited in this regard.

In the present embodiment, the filter layer 112B of the second color region C2 is blue color and the light-emitting diode 122B emits blue light. Since the blue light from the light-emitting diode 122B has higher linearity, most of the blue light may transfer straight and pass the filter layer 112B, and a portion of the blue light may be transformed by the color conversion layer 160 to another light which transfer towards all the directions. Therefore, a portion of the light that transferred toward the first spacer layer 240 is absorbed by the first spacer layer 240, but is not reflected by the reflective layer 130. In addition, the rest of the light that transfer towards the filter layer 112B is filtered such that the light transfers from the second color region C2 is a blue light which may not be transferred. That is, since the filter layer 112 (that is the color corresponds to the second color region C2) and the light-emitting diode 112 have the same color, color conversion is not required for the second color region C2. Therefore, with such configuration, another light that is transformed can be absorbed such that the light that passes the second color region C2 may be closer to pure blue light. In some embodiments, the light that passes the second color region C2 can be pure blue light if there is no color conversion layer 160 and the filter layer 112.

Accordingly, when there is color conversion layer 160 located between the filter layer 112B and the light-emitting diode 122B of the second color region C2, another light transfer toward the first spacer layer 240 facing two sides of the second color region C2 can be absorbed but not be reflected to the filter layer 112B by disposing the first spacer layer 240 formed by the light-absorbing photoresist material to face the second color region C2. Therefore, the light passed the filter layer 112B of the second color region C2 is mostly the pure blue light from the light-emitting diode 122B. In addition, since blue light has higher linearity, even the light passing the first substrate 110 may be reduced due to another light that is transformed is absorbed, the blue light that is not transformed and passes the second color region C2 directly may provide enough light emitting efficiency. In some other embodiments, the filter layer 112 and the light-emitting diode 122 of the second color region C2 may be green light. In other words, the first spacer layer 240 formed by the light-absorbing photoresist material is disposed to face the color region of which the filter layer 112 and the light-emitting diode 122 have the same color, that is, the color region in which color conversion is not required.

In the present embodiment, the filter layers 112 of the first color region C1 and the third color region C3 and the light-emitting diodes 122 have different color. For example, the filter layers 112 may be red or green, and the light-emitting diode 122 has blue light or green light. As described in the embodiment shown in FIG. 1, a portion of the another light that is transformed is reflected by the reflective layer 130 toward the filter layers 112 of the first color region C1 and the third color region C3 after passing the first spacer layer 140 so as to increase the light emitting efficiency of the first color region C1 and the third color region C3.

Figure 6:
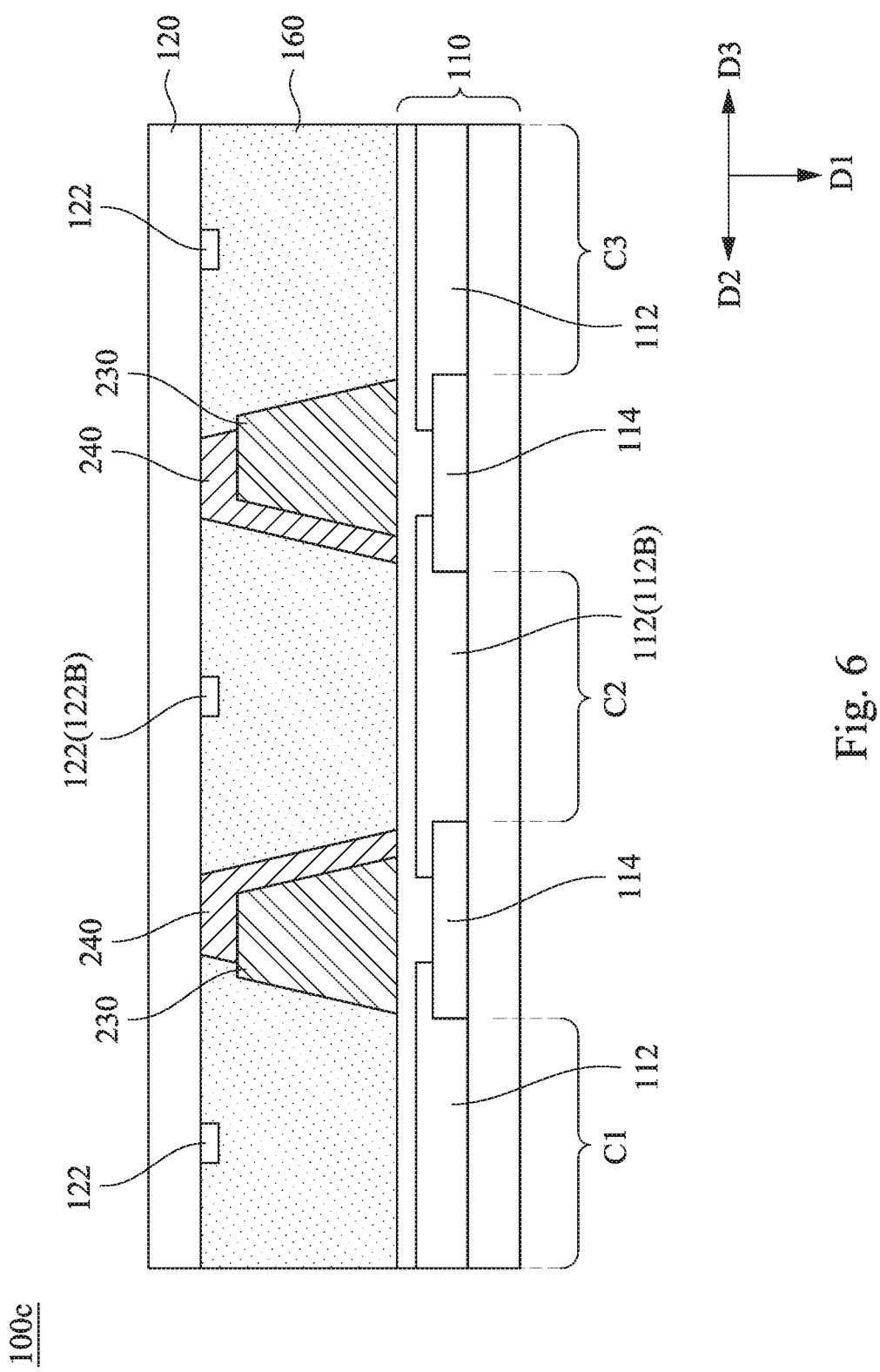

FIG. 6 is a cross-sectional view of the display panel 100c according to some embodiments of the present disclosure. The display panel 100c is similar to the display panel 100b in FIG. 5, the difference is that the display panel 100c has a reflective layer 230 formed by light-reflecting photoresist material, but has no reflective layer 130 and the second spacer layer 150 as shown in FIG. 5. The light-reflecting photoresist material may be organic material or inorganic material, the present disclosure is not limited in this regard.

In the present embodiment, a projection of the black matrix 114 on the substrate 110 covers a projection of the reflective layer 230 on the first substrate 110, and the reflective layer 230 has similar advantages as the reflective layer 130 in FIG. 5. In addition, as shown in FIG. 5, the filter layer 112B and the light-emitting diode 122B of the second color region C2 have the same color, and the filter layer 112 and the light-emitting diode 122 of the first color region C1 and the third color region C3 have different colors. Therefore, the first spacer layer 240 formed by the light-absorbing photoresist layer faces the second color region C2, and the reflective layer 230 faces the first color region C1 and the third color region C3. In other words, reflective layer 230 can be a combination of the reflective layer 130 and the second spacer layer 150 as shown in FIG. 5. Therefore, the display panel 100b has similar advantages as the display panel 100b, and the description is not repeated hereinafter.

Figure 7:
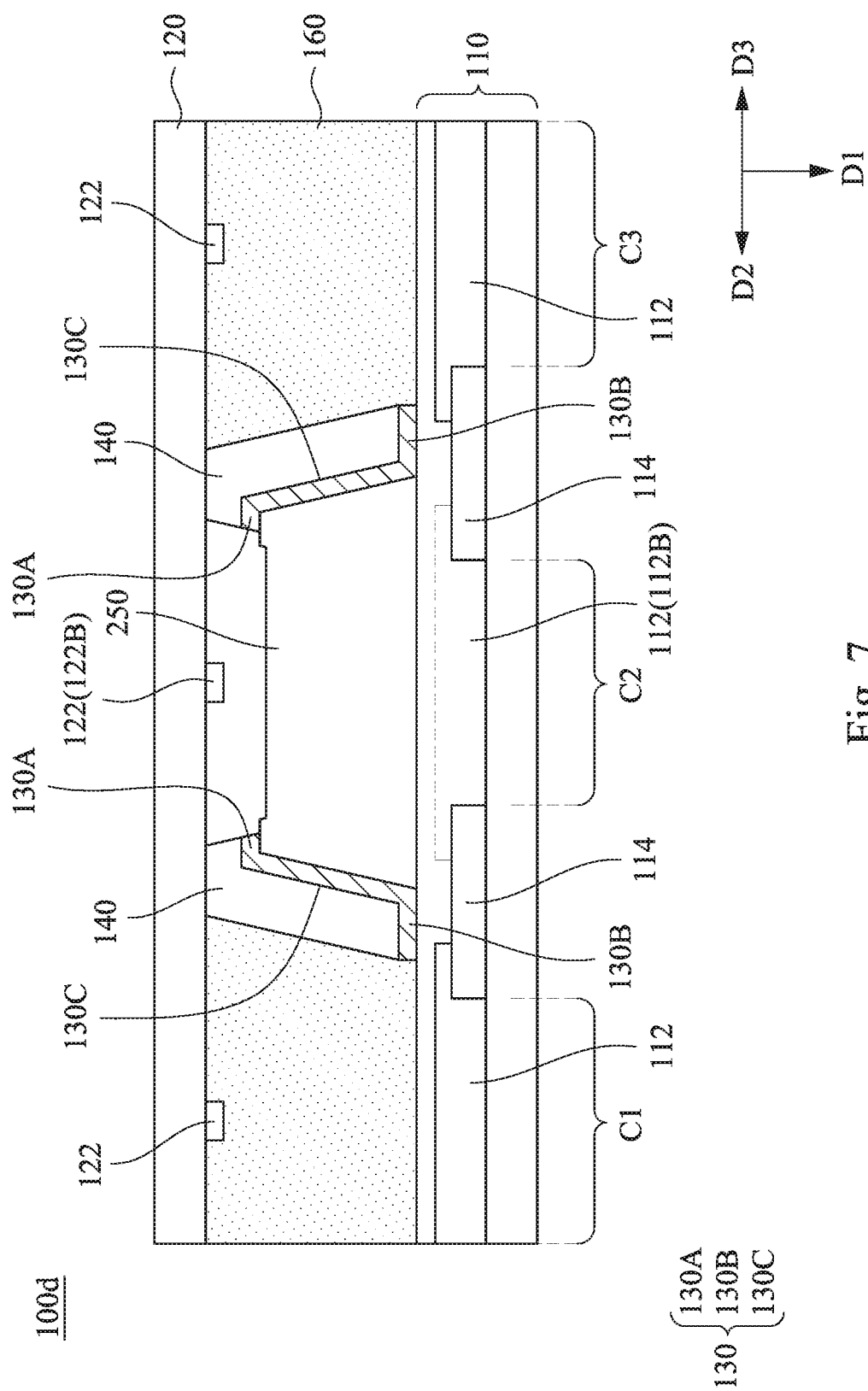

FIG. 7 is a cross-sectional view of the display panel 100d according to some embodiments of the present disclosure. The display panel 100d is similar to the display panel 100 in FIG. 1, the difference is that the second spacer layer 250 is overlapped with a color region that a color conversion is not required along the first direction D1, and the second space layer 250 is located between the reflective layers. In the present embodiment, the filter layer 112B and the light-emitting diode 122B of the second color region C2 are blue. The second spacer layer 250, the filter layer 112B of the second color region C2, adjacent two of the filter layers 114 and the light-emitting diode 122B are overlapped along the first direction D1. In the sight of the present embodiment, the first spacer layers 140 and the reflective layers 130 located at two sides of the second spacer layer 250 are in mirror symmetry manner. In other words, the reflective layers at two sides are respectively located at opposite two sides of the second spacer layer 250 and located between the first spacer layers 140 at two sides. The first sections 130A of the reflective layers 130 at two sides extend toward each other, and the second sections 1308 of the reflective layer 130 at two sides extend reversely.

In the present embodiment, as shown in FIG. 7, there is no color conversion layer 160 formed between the second spacer layer 250 and the second substrate 120. In some other embodiments, a few of the material of the color conversion layer 160 may formed between the second spacer layer 250 and the second substrate 120, it can be adjusted depend on the forming method of the color conversion layer 160 (e.g., injection or polish after spray), but the present disclosure is not limited in this regard. That is, the blue light of the second color region C2 can pass the second spacer layer 250 and the filter layer 112B without passing the color conversion layer 160. Or, since the blue light from the light-emitting diode 122B has higher linearity, merely a few of the blue light is transformed and pass the second spacer layer 250 and the filter layer 112B even there is color conversion layer 160 filled between the second spacer layer 250 and the second substrate 120. Accordingly, most of the light from the second color region C2 come from the blue light of the light-emitting diode 122B. Therefore, in some embodiments, the filter layer 122B of the second color region C2 may be selectively omitted, and the light emitting efficiency of the blue light of the second color region C2 is not affected.

In some embodiments, the filter layer 112 and the light-emitting diode 122 that is overlapped with the second spacer layer 250 along the first direction D1 may both correspond to green light. In the present embodiment, the filter layer 112 and the light-emitting diodes 122 of the first color region C1 and the third color region C3 correspond to different color.

For example, the filter layers 112 may be red color or green color, and the light-emitting diode 122 may has green light or blue light. As described in the embodiment shown in FIG. 1, another light that is transformed is reflected by the reflective layer 130 toward the filter layers 112 of the first color region C1 and the third color region C3 after passing the first spacer layer 140 so as to increase the light-emitting efficiency of the first color region C1 and the third color region C3.

Figure 8:
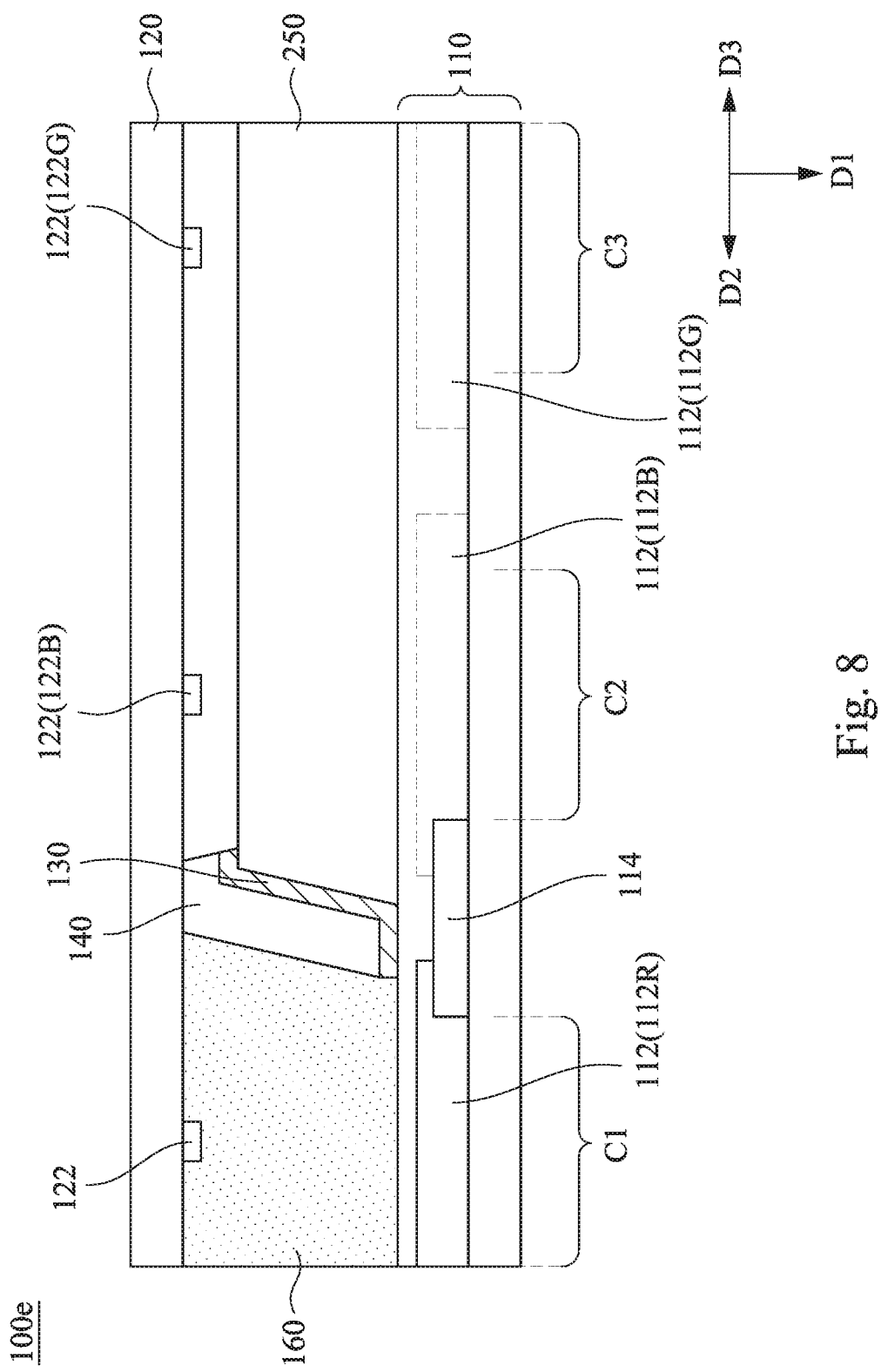

FIG. 8 is a cross-sectional view of the display panel 100e according to some embodiments of the present disclosure. The display panel 100e is similar to the display panel 100d in FIG. 7, the difference is that the second spacer layer 250 extends and continuous cover adjacent two color regions. There is no first spacer layer 140, the reflective layer 130, and the black matrix 114 between these adjacent two color regions. In the present embodiment, the light-emitting diode 122B of the second color region C2 has blue light, and the light-emitting diode 122G of the third color region C3 has green light.

As described in FIG. 7, the second spacer layer 250 and the second substrate 120 may has color conversion layer 160 or has no color conversion 160 therebetween. In the embodiment shown in FIG. 8, there is no color conversion layer 160 formed between the second spacer layer 250 and the second substrate 120. That is, the blue light in the second color region C2 may not be transformed by the color conversion 160 and pass the second spacer layer 250 and the filter layer 112G. Or, since the blue light of the light-emitting diode 122B and the green light of the light-emitting diode 122G have higher linearity, merely a few of the blue light and the green light are transformed and pass the second spacer layer 250 and the filter layer 112B, 112G even there is color conversion layer 160 filled between the second spacer layer 250 and the second substrate 120.

Accordingly, most of the light from the second color region C2 comes from the blue light of the light-emitting diode 122B, and most of the light from the third color region C3 comes from the green light of the light-emitting diode 122G. Therefore, in some embodiments, the filter layer 112B of the second color region C2 and the filter layer 112G of the third color region C3 may be selectively omitted, and the light emitting efficiency of the second color region C2 and the third color region C3 are not affected.

In addition, since the light-emitting diode 122B and the light-emitting diode 122G have higher linearity, the light emitting efficiency of the second color region C2 and the third color region C3 are not affected even there is no black matrix 114 deposited between the second color region C2 and the third color region C3. In other words, the light that pass the second color region C2 can be considered as a pure blue light form the light-emitting diode 122B, and the light that pass the third color region C3 can be considered as a pure green light from the light-emitting diode 122G.

In the present embodiment, the filter layer 112R of the first color region C1 is red, the light-emitting diode 122 of the first color region C1 may have blue light or green light. As described above, a portion of the another light that is transformed is reflected by the reflective layer 130 toward the filter layers 112R of the first color region C1 after passing the first spacer layer 140 so as to increase the light emitting efficiency of the first color region C1.

Figure 9:
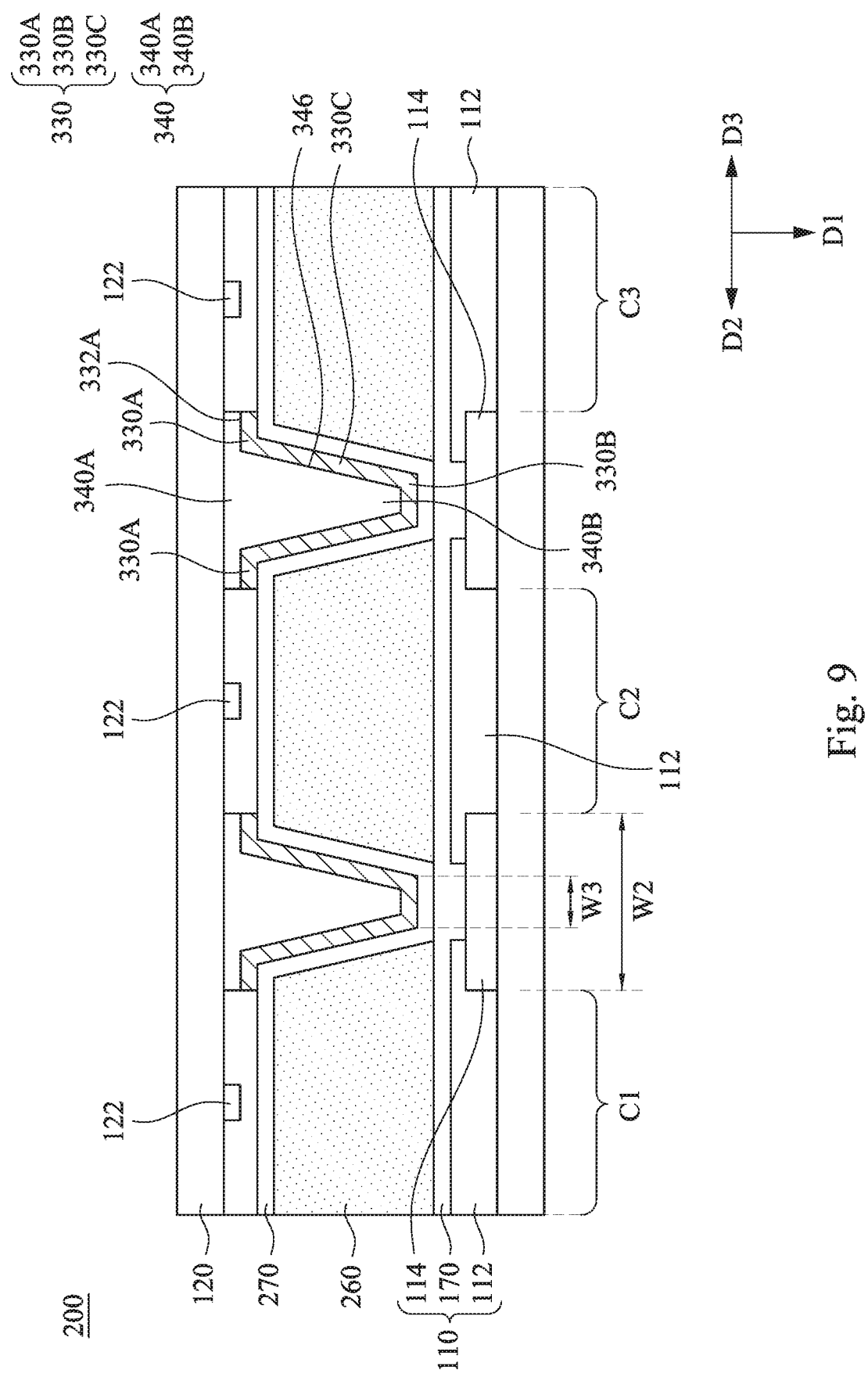
FIG. 9 is a cross-sectional view of a display panel according to another embodiment of the present disclosure.

FIG. 9 is a cross-sectional view of a display panel 200 according to another embodiment of the present disclosure. The display panel 200 includes a first substrate 110, a second substrate 120, a reflective layer 330, a first spacer layer 340, a color conversion layer 260, and a light-emitting diode 122.

The first substrate has a filter layer 112, a black matrix 114, and a protection film 170. Configurations of the first substrate 110, the second substrate 120, the filter layer 112, the black matrix 114, the protection film 170, and the light-emitting diode 122 are the same as the embodiment shown in FIG. 1, the description is not repeated hereinafter.

In the present embodiment, the reflective layer 330 is located on the first substrate 110 and protrudes toward the second substrate 120. The first spacer layer 340 is located between the first substrate 110 and the second substrate 120, and the first spacer layer 340 has a first end 340A and a second end 340B. The first end 340A of the first spacer layer 340 is located between a surface 332A of the reflective layer 330 close to the second substrate 120 and the second substrate 120. The first spacer layer 340 includes transparent insulation material.

In the present embodiment, a material of the reflective layer 330 includes metal, and the reflective layer 330 has two first sections 330A, a second section 330B, and two third section 330C respectively connected with the first sections 330A and the second section 330B. The second section 330B is located between the first spacer layer 340 and the first substrate 110, the two third sections 330C are in contact with two opposite sidewalls 346 of the first spacer layer 340. In other words, the first spacer layer 340 separated the reflective layer 330 and the second substrate 120, and the first spacer layer 340 is covered by the reflective layer 330. In addition, the two first sections 330A reversely extend toward the second direction D2 and the third direction D3. In some embodiments, the display panel 200 further includes a protection layer 270 located between the color conversion layer 260 and the reflective layer 330 so as to protection the color conversion layer 260 during the process of forming the reflective layer 330. The protection layer 270 and the protection film may be the same insulation layers or transparent conductive layers.

In the present embodiment, since the light of the light-emitting diode 122 transfer toward all the directions after being transformed by the color conversion layer 260, a portion of the light transfer toward the reflective layer 330 can pass the first color region C1, the second color region C2, and the third color region C3 of the first substrate 110 after being reflected. Therefore, the light-emitting efficiency of the display panel 200 can be increased by the reflective layer 330. However, the difference between the display panel 200 and the embodiment shown in FIG. 1 is that, with the second color region C2 as an example, another light transfer toward all the directions after being transformed by the color conversion layer 260 may be reflected by two third sections 330C of one of the reflective layers 330 at two sides that is closer to the second color region C2. That is, another light of each of the color regions is reflected by the third sections 330C of the reflective layer 330 at two sides.

In the present embodiment, a projection of the reflective layer 130 on the first substrate 110 is within a projection of the black matrix 114 on the first substrate 110. In other words, the projection of the reflective layer 330 on the first substrate 110 is smaller or equal to the projection of the black matrix 114 on the first substrate 110. Specifically, since the second section 330B of the reflective layer 330 is adjacent to the first substrate 110, the black matrix 114 has to cover at least the second section 330B of the reflective layer 330. In other words, the projection of the black matrix 114 on the first substrate 110 may cover the projection of the second section 330B of the reflective layer 330 on the first substrate 110.

As shown in FIG. 9, the second section 330B of the reflective layer 330 has a width W3 along the second direction D2 parallel with the first substrate 110, the black matrix 114 has a width W2 along the second direction D2 parallel with the first substrate 110, and the width W3 is smaller or equal to the width W2. As such, the mixed light of another light from the light-emitting diode 122 and the light that is transformed and transfer toward the first substrate 110 can be prevented from leaking between two color regions.

Figure 10:
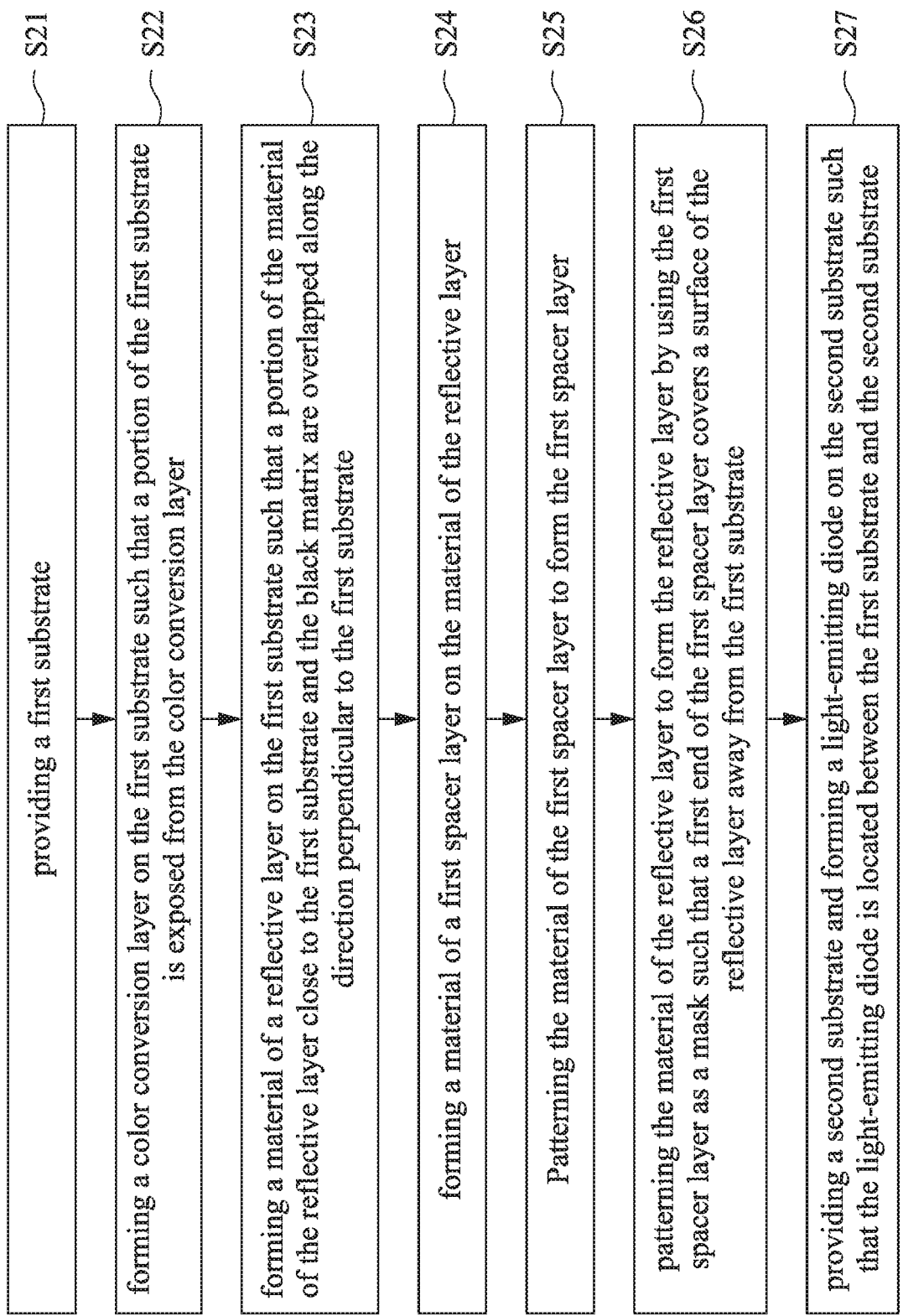
FIG. 10 is a flow chart of a fabrication method of the display panel in FIG. 9.

FIG. 10 is a flow chart of a fabrication method of the display panel 200 in FIG. 9. FIGS. 11A to 11G are cross-sectional views of the display panel 200 in FIG. 9 at different stages of the fabrication method in FIG. 10.

Reference is made to FIG. 10 and FIG. 11A, in step S21, providing a first substrate 110. The first substrate 110 includes a filter layer 112, a black matrix 114, and a protection film 170. The protection film 170 covers the black matrix 114 and the filter layer 112 so as to protect the filter layer 112 and the black matrix 114 in the subsequent processes.

Figure 11B:
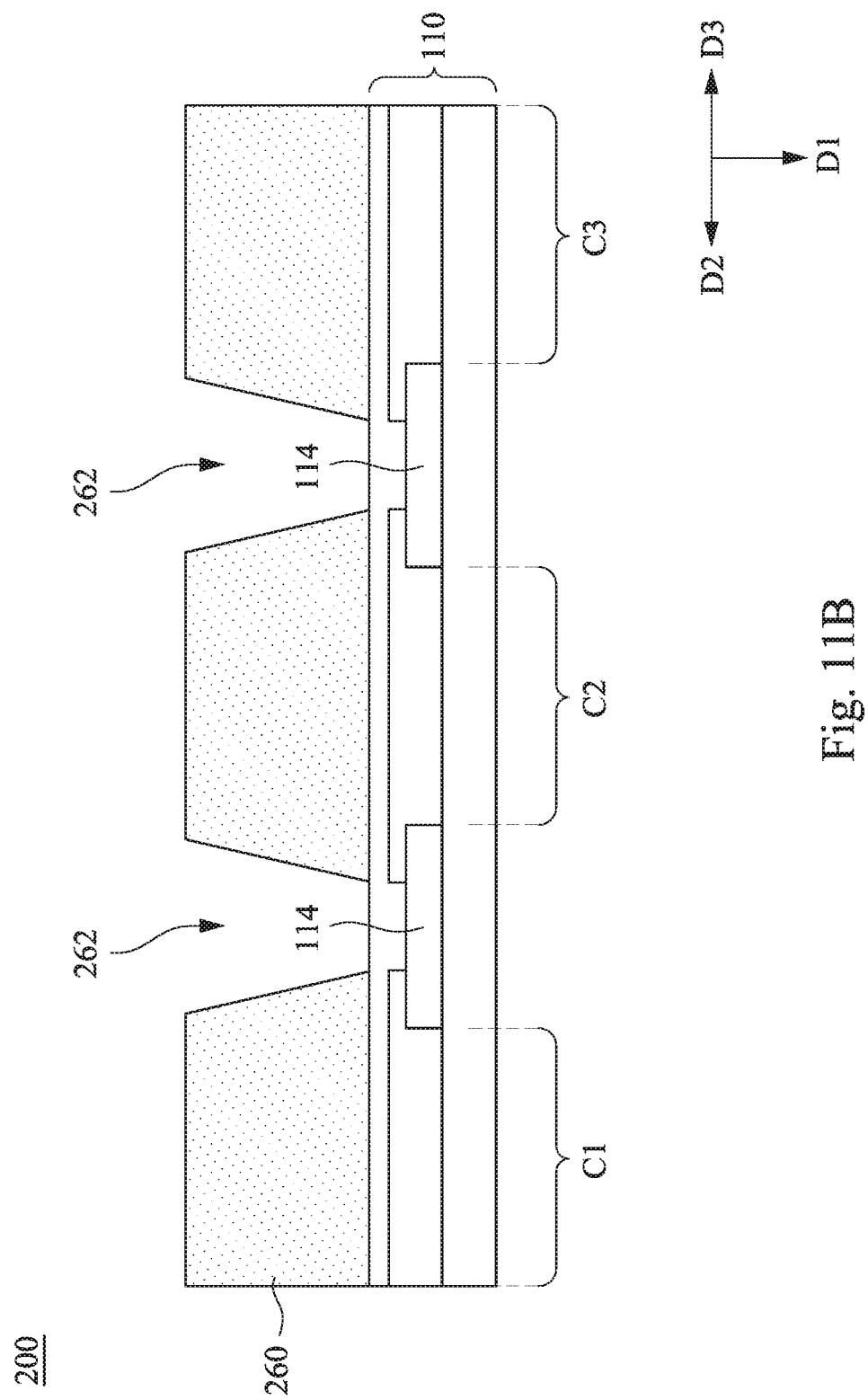

Reference is made to FIG. 10 and FIG. 11B, in step S22, covering a material of a color conversion layer on the first substrate 110 and patterning the material of the color conversion layer so as to form a color conversion layer 260 on the first substrate 110 and expose a portion of the first substrate 110 from the color conversion layer 260. Specifically, a portion of the color conversion layer which is overlapped with the black matrix 114 along the first direction D1 is removed to form an opening 262, and a projection of the opening 262 on the first substrate 110 is within a projection of the black matrix 114 on the first substrate 110.

Figure 11C:
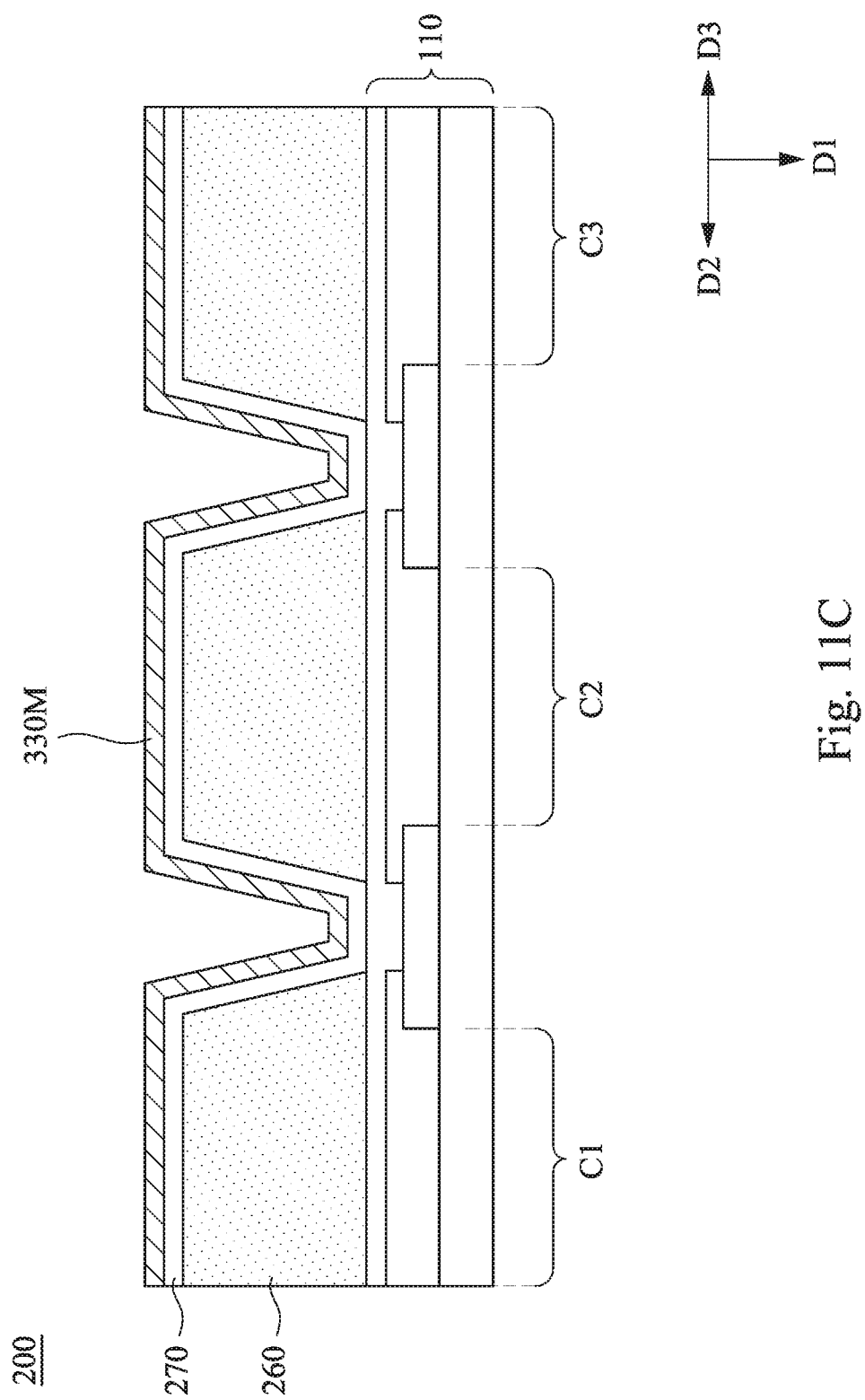

Reference is made to FIG. 10, FIG. 11B, and FIG. 11C, in step S23, forming a material of a reflective layer 330M on the first substrate 110 such that a portion of the material of the reflective layer 330M close to the first substrate 110 and the black matrix 114 are overlapped along the first direction D1 perpendicular to the first substrate 110. In some embodiment, as described in FIG. 9, a protection layer 270 may be formed before forming the reflective layer 330. The material of the protection layer 270 may be insulation material or transparent conductive layer (e.g., ITO) so as to protection the filter layer 112, the black matrix 114, and the color conversion layer 260 of the first substrate 110 in the subsequent steps.

Figure 11D:
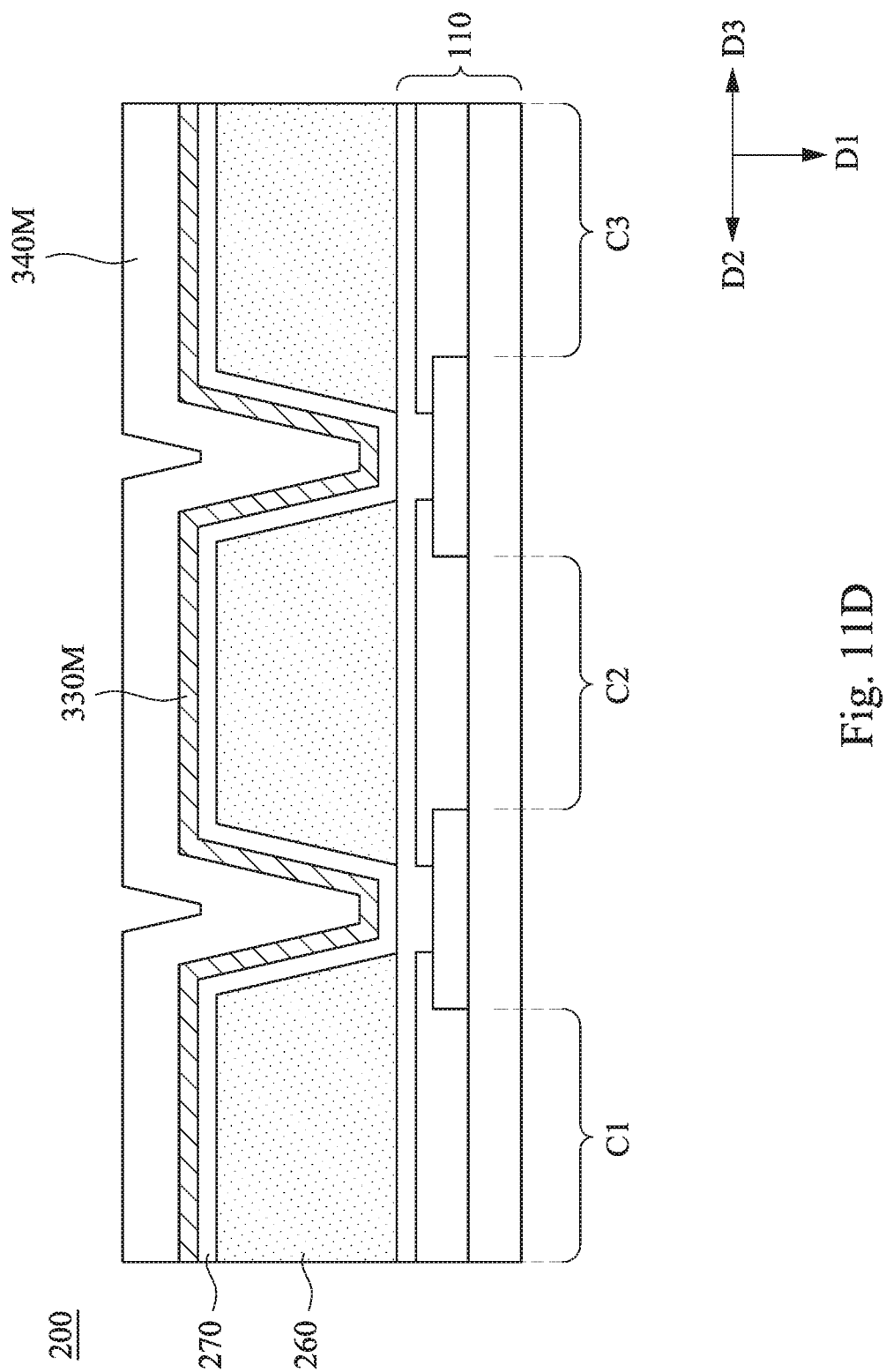

Reference is made to FIG. 10 and FIG. 11D, in step S24, forming a material of a first spacer layer 340M on the material of the reflective layer 330M.

Figure 11E:
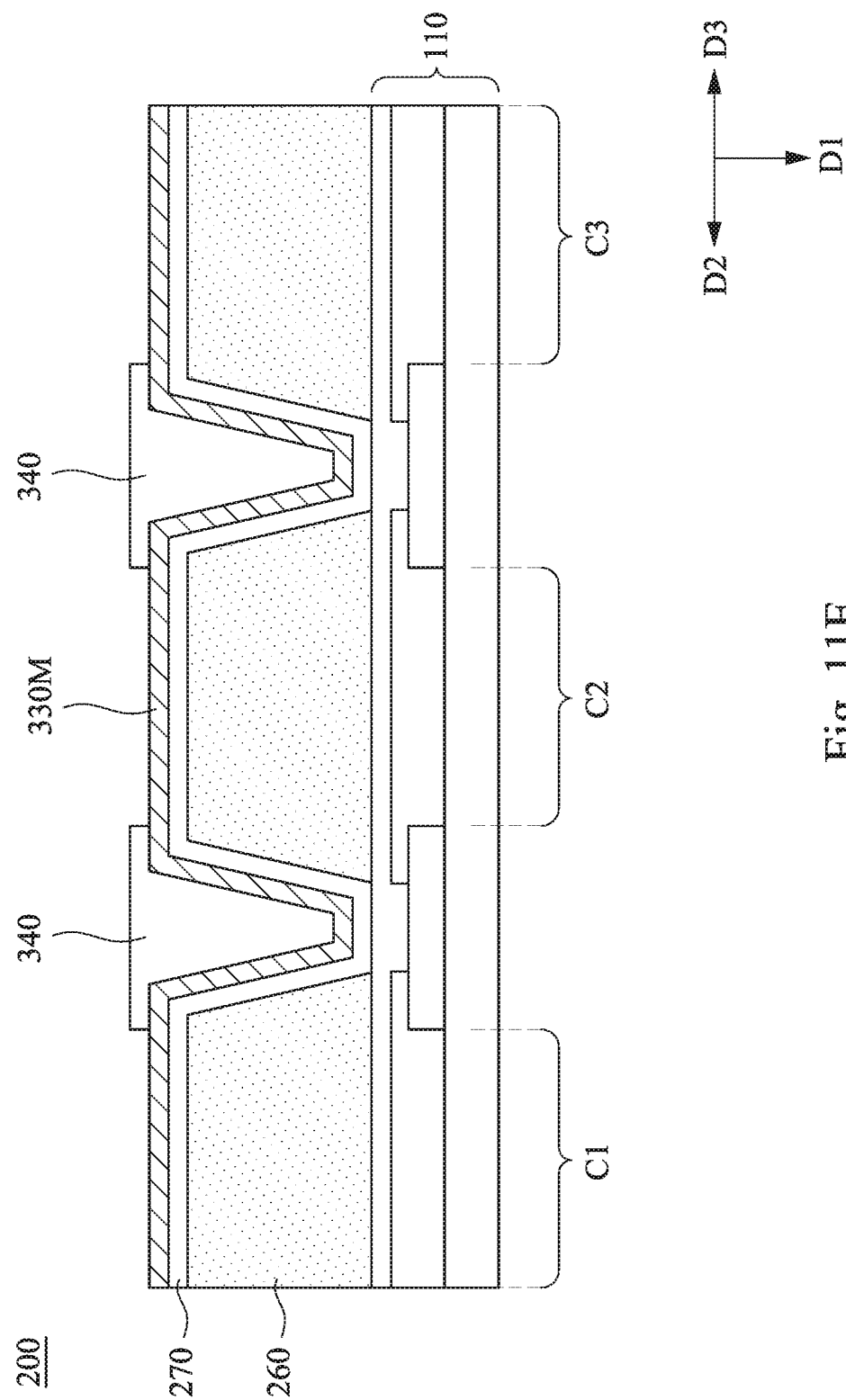

Reference is made to FIG. 10 and FIG. 11E, in step S25, patterning the material of the first spacer layer 340M to form the first spacer layer 340. As shown in FIG. 11E, a portion of the material of the reflective layer 330M that is surrounded by the color conversion layer 260 is covered by the first spacer layer 340, and most of the material of the reflective layer 330M located above the color conversion layer 260 is exposed form the first spacer layer 340. In the present embodiment, since the first spacer layer 340 is formed after patterning the color conversion layer 260, a width of the first spacer layer 340 close to the second substrate 120 is greater than a width of the first spacer layer 340 close to the first substrate 110.

Figure 11F:
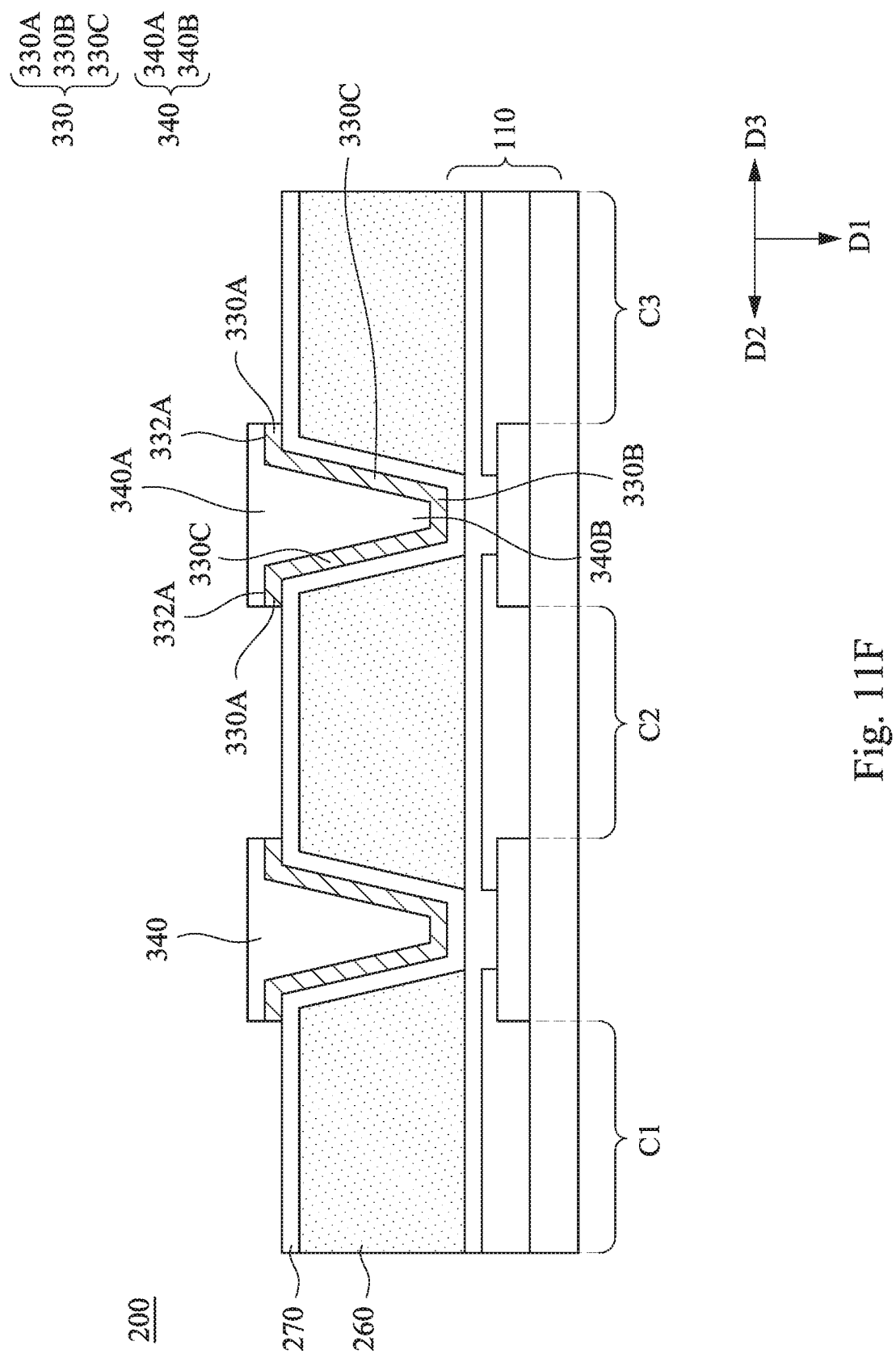

Reference is made to FIG. 10, FIG. 11E, and FIG. 11F, in step S26, patterning the material of the reflective layer 330M to form the reflective layer 330 by using the first spacer layer 340 as a mask. A portion of the material of the reflective layer 330M which is not covered by the first spacer layer 340 and is located above the color conversion layer 260 is removed so as to form the first section 330A of the reflective layer 330. The first end 140A of the first spacer layer 140 covers a surface 132A of the reflective layer 130 away from the first substrate 110, and a second section 130B of the reflective layer 130 and the right portion of the black matrix 114 are overlapped along the first direction D1. The first end 340A of the first spacer layer 340 covers the surface 332A of the first section 330A of the reflective layer 330. That is, the first end 340A of the first spacer layer 340 defines the length of the first section 330A of the reflective layer 330. In addition, in step S22 (see FIG. 11B), the opening 262 formed by patterning the color conversion layer 260 defines a width of the second section 330B of the reflective layer 330 along the second direction D2 and a distance between the two third section 330C of the color conversion layer 260 defines a width of the second section 330B of the reflective layer 330.

Figure 11G:
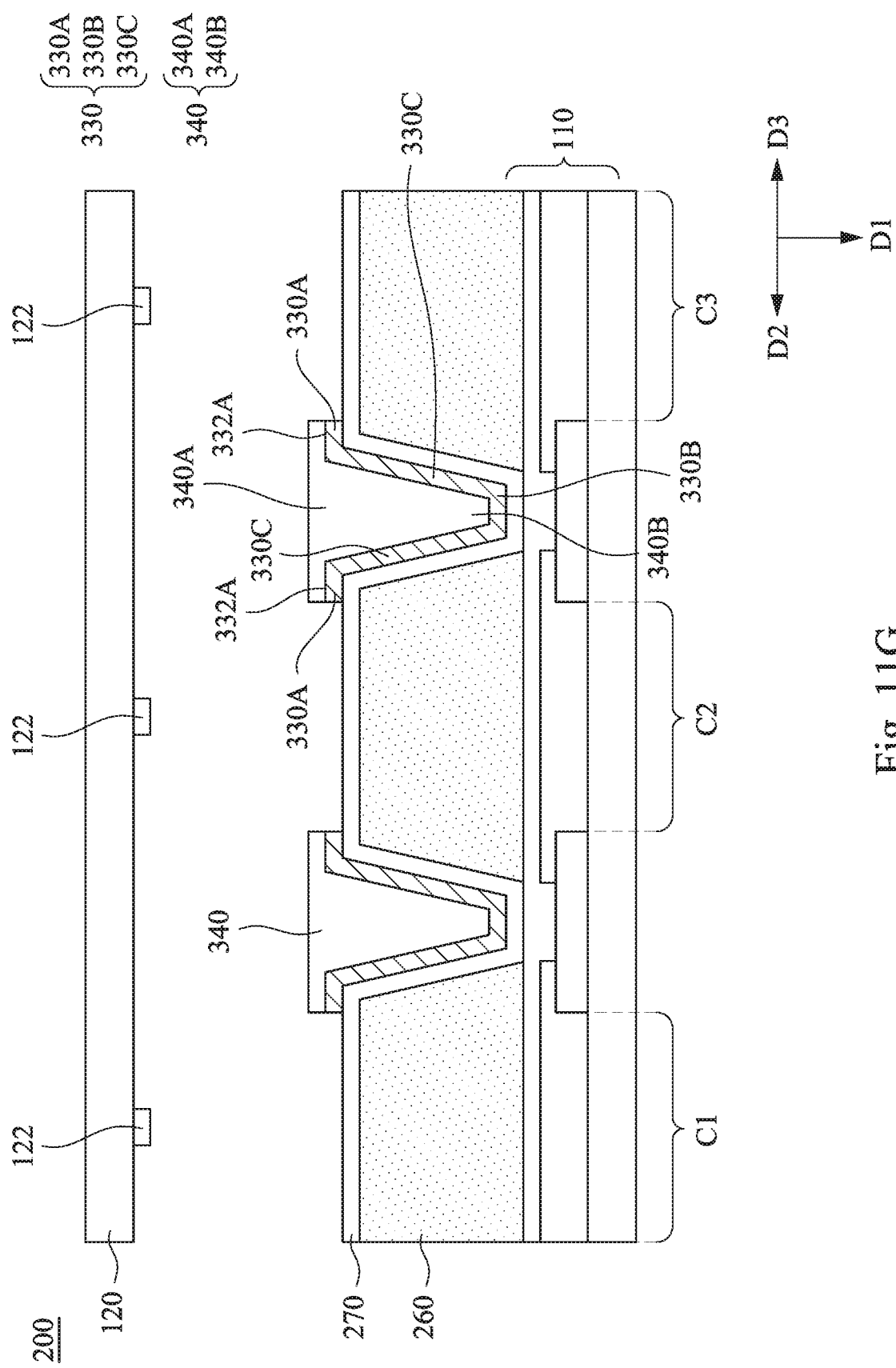

Reference is made to FIG. 10 and FIG. 11G, in step S27, providing the second substrate 120, and forming the light-emitting diode 122 on the second substrate 120 such that the light-emitting diode 122 is located between the first substrate and the second substrate 120. As such, the display panel 200 as shown in FIG. 9 can be prepared. In the present embodiment, the first spacer layer 340 can be formed after defining the third section 330C of the reflective layer 330 by patterning the color conversion layer 260 first such that the two third sections 330C of the reflective layer 330 may surround the first spacer layer 340. Therefore, a width along the second direction D2 (or the third direction D3) of the light shielding structure formed by the reflective layer 330 and the first spacer layer 340 may be reduced. As such, and interval between adjacent two sub-pixels may be reduced such that the number of the pixels can be increased and the resolution of the display panel 200 can be increased.

Figure 12:
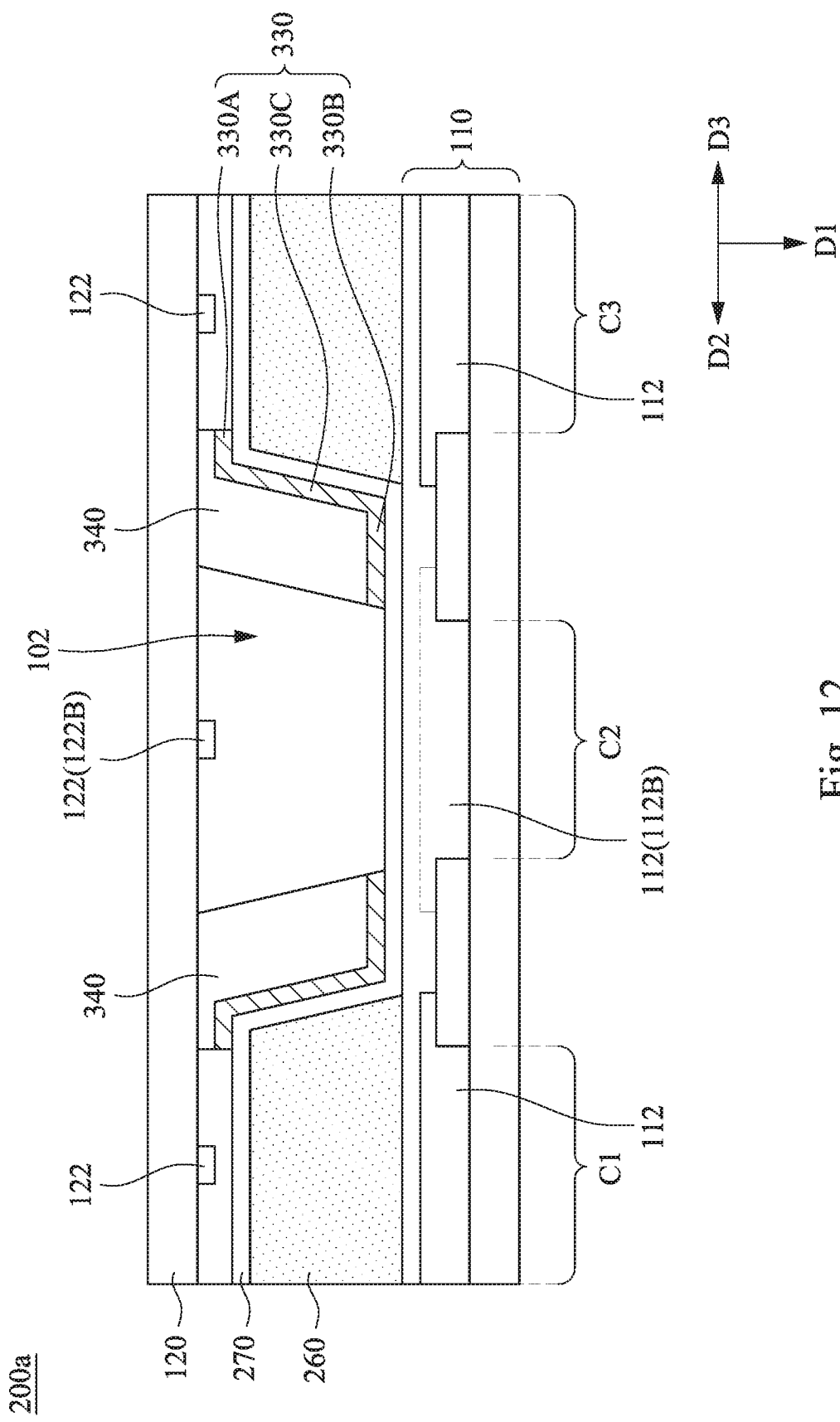
FIGS. 12 to 16 are cross-sectional views the display panels according to some embodiments of the present disclosure.

FIG. 12 is a cross-sectional view of a display panel 200a according to some embodiments of the present disclosure. The display panel 200a is similar to the display panel 200 in FIG. 9, the difference is that the reflective layer 330 has merely on first section 330A and a third section 330C. In the present embodiment, the second color region C2 is a blue sub-pixel, that is, the light-emitting diode 122B has blue light and the color conversion is not required. In addition, since the first spacer layer 340 and the reflective layer 330 are formed after patterning the color conversion layer 260, a cavity 102 is formed after the first spacer layer 340 and the reflective layer 330 of the second color region C2 is removed during patterning. That is, there is no color conversion layer 260 in the second color region C2, and the filter layer 112 may be selectively omitted, and the light emitting efficiency of the blue light of the second color region C2 is not affected. In other words, the light-emitting diode 122B of the second color region C2 pass the cavity 102 directly and pass the first substrate 110. In some embodiments, the light-emitting diode 122 of the second color region C2 may have green light. The cavity 102 between the first substrate 110 and the second substrate 120 of the second color region C2 may have air, nitrogen gas, or can be in vacuum, it may be depend on process situation, and the present disclosure is not limited in this regard.

In the present embodiment, the filter layers 112 and the light-emitting diodes 122 of the first color region C1 and the third color region C3 have different colors. For example, the filter layers 112 may be red or green, and the light-emitting diodes 122 may have blue light or green light. As described above, a portion of the another light that is transformed is reflected toward the filter layers 112 of the first color region C1 and the third color region C3 by the reflective layer 330 so as to increase the light emitting efficiency of the first color region C1 and the third color region C3.

Figure 13:
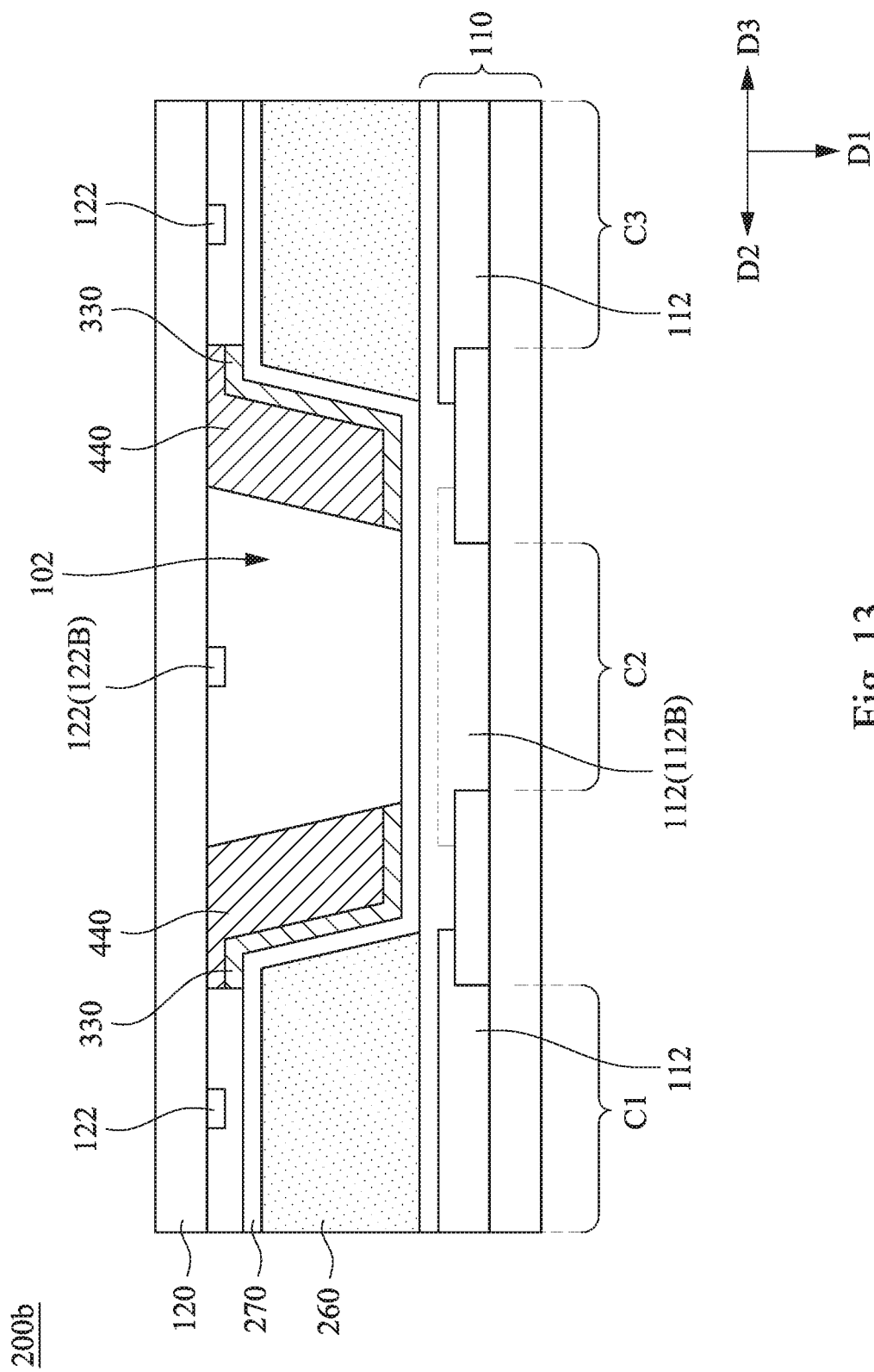

FIG. 13 is a cross-sectional view of a display panel 200*b* according to some embodiments of the present disclosure. The display panel 200*b* is similar to the display panel 200*a* in FIG. 12, the difference is that the first spacer layer 440 includes a light-absorbing photoresist material. The light-absorbing photoresist material may be organic material or inorganic material, the present disclosure is not limited in this regard. In the present embodiment, the second color region C2 is a blue sub-pixel, that is, the light-emitting diode 122B has blue light and the color conversion is not required. As described in the embodiment shown in FIG. 5, the first spacer layer 440 formed by the light-absorbing photoresist material faces the color region in which the color conversion is not required, and the reflective layer 330 faces the color region in which the color conversion is required. As described in the embodiment shown in FIG. 12, a cavity 102 is formed after the first spacer layer 340 and the reflective layer 330 of the second color region C2 is removed during patterning, and there is no color conversion layer 260 in the second color region C2. That is, the filter layer 112 may be selectively omitted such that the light-emitting diode 122 of the second color region C2 may directly pass the first substrate 110. In some embodiments, the light-emitting diode 122 of the second color region C2 may have green light. The configuration of the first color region C1 and the third color region C3 is the same as the display panel 200*a* shown in FIG. 12, and the description is not repeated hereinafter.

Figure 14:
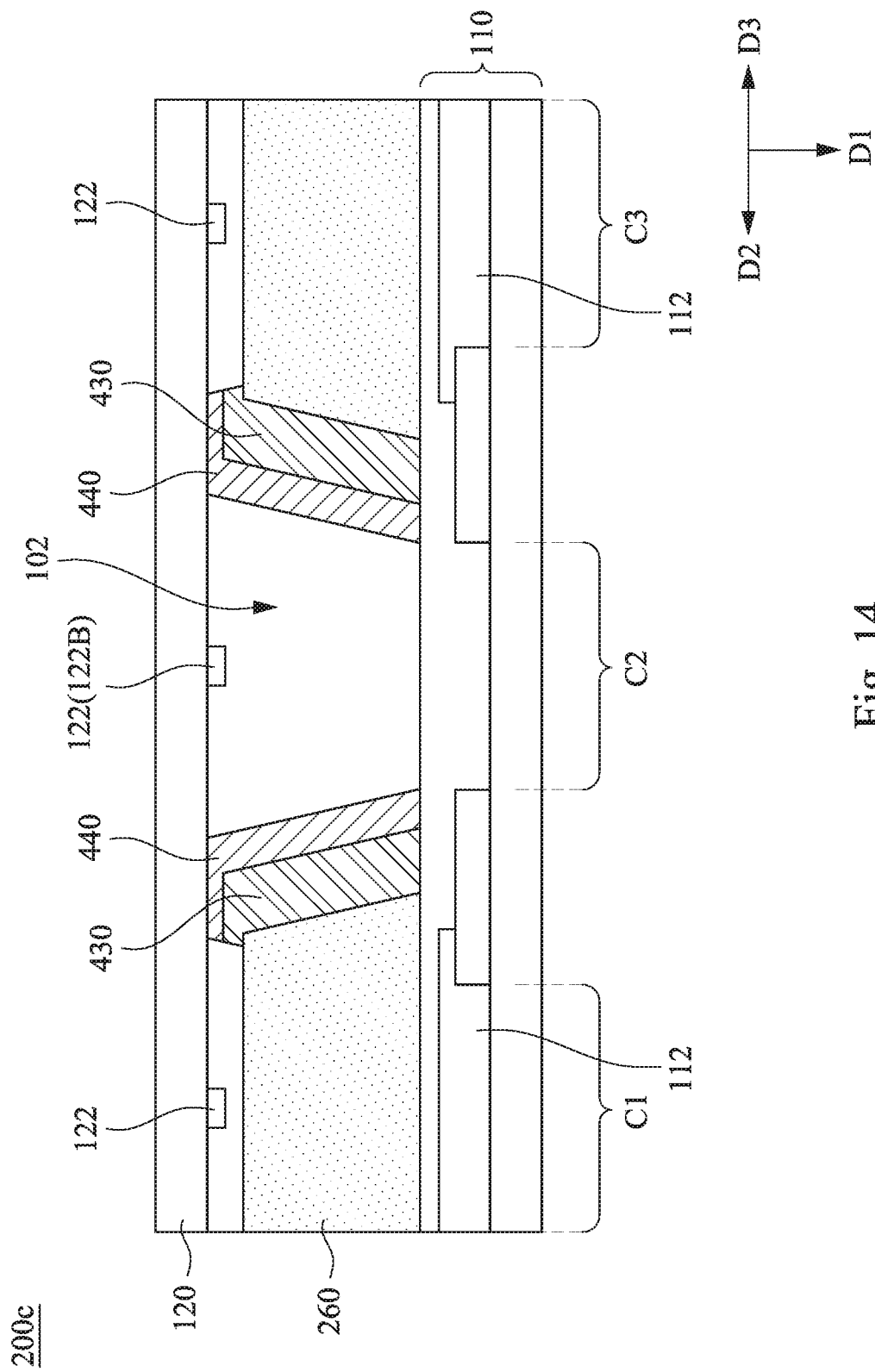

FIG. 14 is a cross-sectional view of a display panel 200*c* according to some embodiments of the present disclosure. The display panel 200*c* is similar to the display panel 200*b* in FIG. 13, the difference is that the reflective layer 430 includes a light-reflecting photoresist material. The light-reflecting photoresist material may be organic material or inorganic material, the present disclosure is not limited in this regard. The reflective layer 430 has similar advantage as the reflective layer 430 including metal as shown in FIG. 13, and description is not repeated hereinafter. The second color region and the light emitting diode 122 have the same color, and the filter layers and the light-emitting diodes of the first color region C1 and the third color region C3 have different color. Therefore, the first spacer layer 440 faces the second color region C2, and the reflective layer 430 faces the first color region C1 and the third color region C3. In some embodiment, the light-emitting diode of the second color region C2 may have green light. The configuration of the first color region C1 and the third color region C3 is the same as the display panel 200*b* shown in FIG. 13, and the description is not repeated hereinafter.

Figure 15:
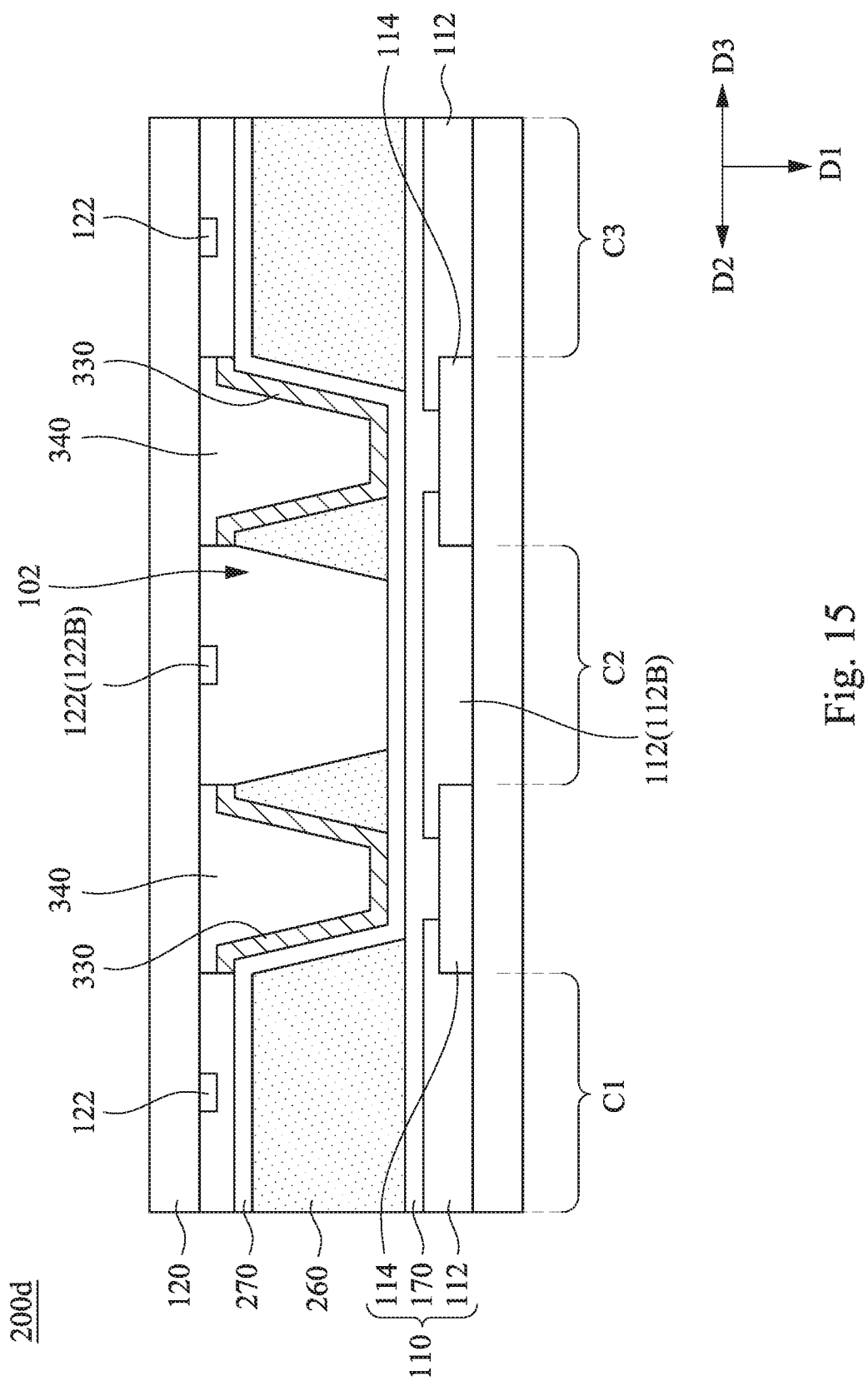

FIG. 15 is a cross-sectional view of a display panel 200*d* according to some embodiments of the present disclosure. The display panel 200*d* is similar to the display panel 200 in FIG. 9, the difference is that a portion of the color conversion layer 260 in the second color region C2 is removed so as to form a cavity 102, and the filter layer 112 and the light-emitting diode 122 of the second color region C2 have the same color. The cavity 102 may have air, nitrogen gas, or can be in vacuum, it may be depend on process situation, and the present disclosure is not limited in this regard. In the present embodiment, the second color region C2 is a blue sub-pixel, that is, the light-emitting diode 122B has blue light and the color conversion is not required. Therefore, since the blue light has higher linearity, most of the blue light may transfer straight and pass the filter layer 112B without being transformed. A portion of the another light that is transformed by the color conversion layer 260 may still be filtered when passing the filter layer 112B through reflecting by the reflective layer 330. In some embodiments, the light-emitting diode 122 of the second color region C2 may have green light. The configuration of the first color region C1 and the third color region C3 are the same as the display panel 200*a* shown in FIG. 12, and the description is not repeated hereinafter.

Figure 16:
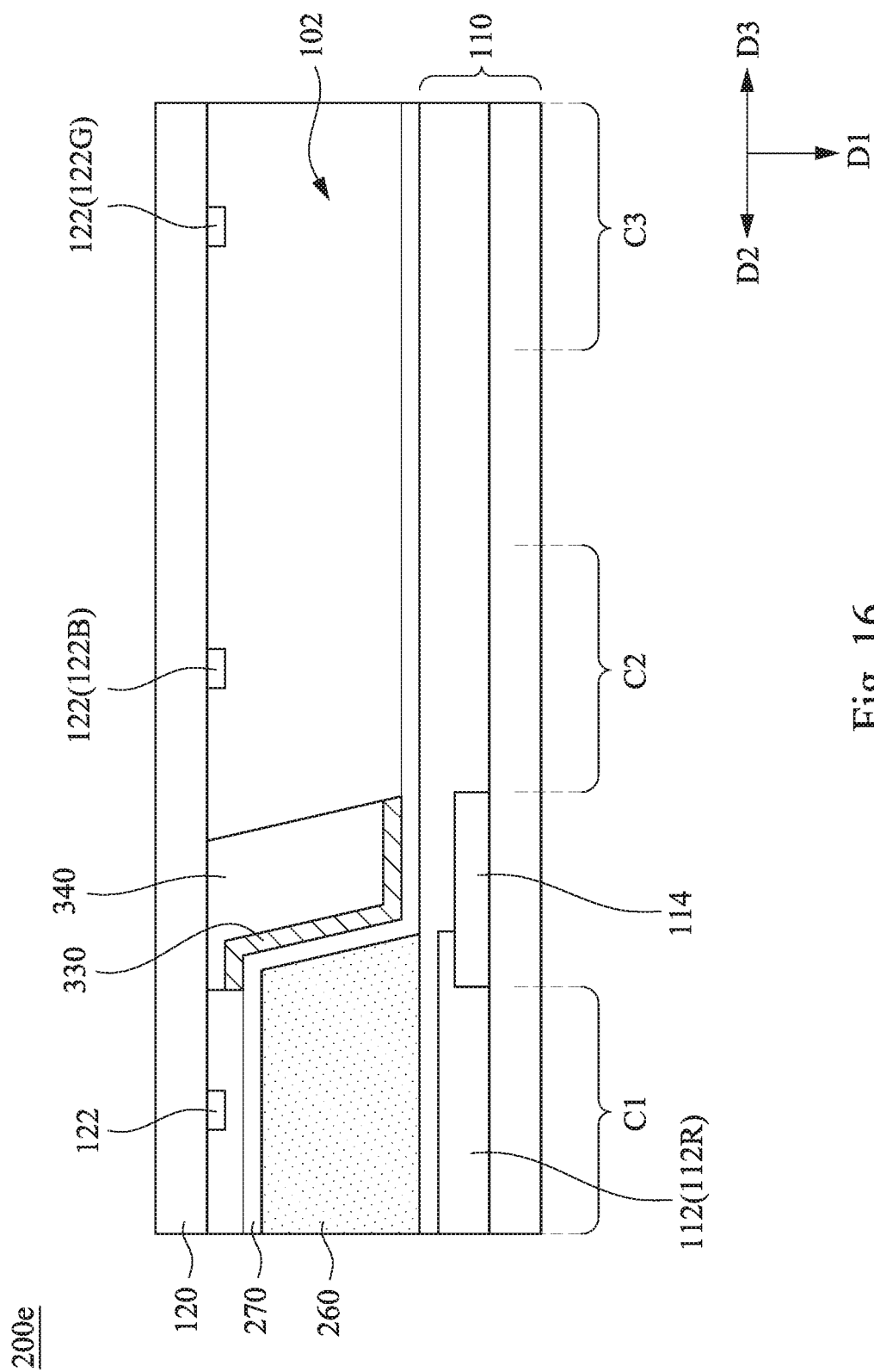

FIG. 16 is a cross-sectional view of a display panel 200*e* according to some embodiments of the present disclosure. The display panel 200*e* is similar to the display panel 200*a* in FIG. 12, the difference is that there is no reflective layer 330, the first spacer layer 340, and the black matrix 114 between the second color region C2 and the third color region C3. In the present embodiment, the light-emitting diode 122B of the second color region C2 is a has green light, the light-emitting diode 122G of the third color region C3 has green light, and there is not filter layers 112 in the second color region C2 and the third color region C3. That is, the blue light from the light-emitting diode 122B and the green light from the light-emitting diode 122G may directly pass the second color region C2 and the third color region C3. In addition, since the light-emitting diode 122B and the light-emitting diode 122G have higher linearity, most of the blue light and the green light may transfer straight and pass the first substrate 110. Therefore, even there is no black matrix 114 deposited between the second color region C2 and the third color region C3, the light emitting efficiency of the blue light and the green light are not affected. In other words, the light that pass the second color region C2 can be considered as a pure blue light form the light-emitting diode 122B, and the light that pass the third color region C3 can be considered as a pure green light from the light-emitting diode 122G. In the present embodiment, the filter layer 112R of the first color region C1 is red, and the light-emitting diodes 122 of the first color region C1 may have blue light or green light. As described above, the light in the first color region C1 that is transformed is reflected toward the filter layer 112R by the reflective layer 330 so as to increase the light emitting efficiency. In some embodiments, the light-emitting diodes of the second color region C2 and the third color region C3 respectively have blue light and green light.

In the embodiments shown above, by depositing the reflective layer between the first spacer layer and the second spacer layer, or surrounding the first spacer layer by the reflective layer, the width of the light shielding structure formed by the reflective layer and the first spacer layer (and the second spacer layer) along the second direction D2 can be reduced. As such, the interval between adjacent two sub-pixels may be reduced such that the number of the pixels can be increased and the resolution of the display panel can be increased.

Figure 17:
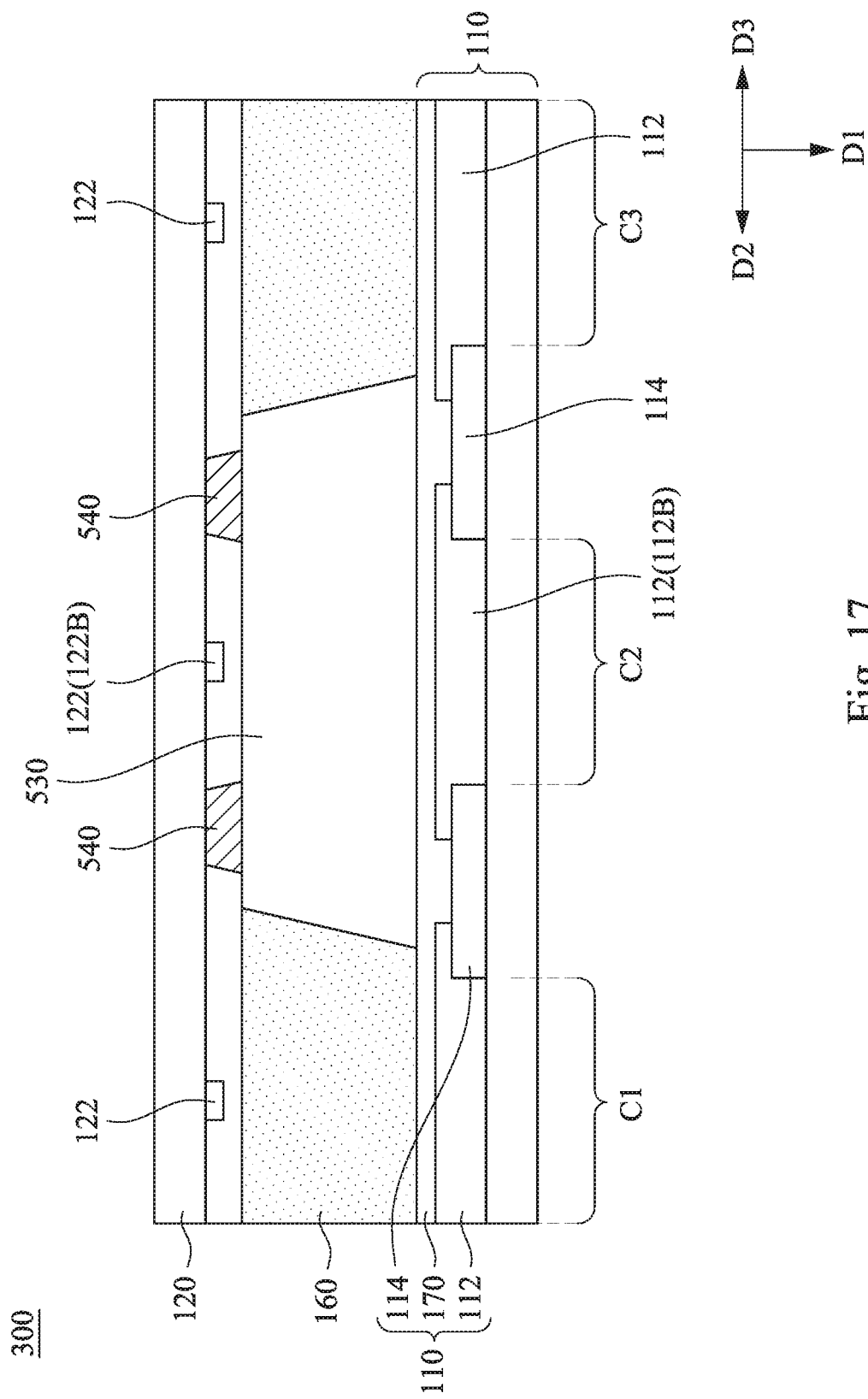
FIGS. 17 to 18 are cross-sectional views the display panels according to some embodiments of the present disclosure.

FIG. 17 is a cross-sectional view of a display panel 300 according to some embodiments of the present disclosure. The display panel 300 includes a first substrate 110, a second substrate 120, a white insulation layer 530, a first spacer layer 450, and a light-emitting diode 122. The second substrate 120 is opposite to the first substrate 110, and the first substrate 110 and the second substrate 120 are arranged along the first direction D1. The first direction D1 herein represent the direction perpendicular to the first substrate 110 and the second substrate 120. The first substrate 110 has a filter layer 112 and a black matrix 114, the light-emitting diode 122 is disposed on the second substrate 120, and the filter layer 112 and the light-emitting diode 122 are overlapped along the first direction D1. The white insulation layer 530 is located on the second substrate 120 and protrudes toward the first substrate 110. The white insulation layer 530 is overlapped with the filter layer 112 and the black matrix 114 along the first direction D1. The first spacer layer 540 is disposed between the second substrate 120 and the white insulation layer 530, and the first spacer layer 540 is overlapped with the black matrix 114 along the first direction D1. In the present embodiment, the white insulation layer 530 includes a light-reflecting photoresist material, and the first spacer layer 540 includes a light-absorbing photoresist material. A portion of the light from the light-emitting diode 122 is reflected or scattered by the white insulation layer 530, and another portion of the light may transmit through the white insulation layer 530.

In the present embodiment, the filter layer 112B of the second color region C2 is blue, and the light-emitting diode 122B has blue light. Since the blue light has higher linearity, most of the blue light may transmit through the white insulation layer 530 and pass the filter layer 12B, and a portion of the blue light may transmit toward the first color region C1 and the third color region C3. Since the light may be reflected by white insulation layer 530 partially and transmit through the white insulation layer 530 partially, the light from the light-emitting diode 122 of the second color region C2 can be completely reflected before reaching the first color region C1 and the third color region C3 as long as the extension range of the white insulation layer 530 from the second color region C2 to the first color region C1 and the third color region C3 is wide enough. In addition, after the light from the light-emitting diode 122 of the second color region C2 being reflected or scattered by the white insulation layer 530 a portion of the light transfers toward the first spacer layer 540 is absorbed. Accordingly, as long as the width of the white insulation layer 530 and the first spacer layer 540 along the second direction D2 is wide enough, the light mixing problem of the light form the light-emitting diode 122B when transferring to the first color region C1 and the third color region C3 after transmitting or being reflected may be avoided.

In some embodiments, the light-emitting diode 122 and the filter layer 114 of the color region C2 may both correspond to green light. In other words, by depositing the white insulation layer 530 that the light may partially be reflected and the light may partially transmitted through at the color region of which the light-emitting diode 122 and the filter layer 112 have the same color, the color mixing problem between color regions may be avoided. In addition, by overlapping the white insulation layer 530 that the light may partially be reflected and the light may partially transmitted through and the first spacer layer 540 formed by the light-absorbing photoresist material along the first direction D1, but not stacking the white insulation layer 530 and the first spacer layer 540 along the second direction D2, the width of the light shielding structure (that is the overall structure of the white insulation layer 530 and the first spacer layer 540) along the second direction D2 may be reduced. As such, and interval between adjacent two sub-pixels may be reduced such that the number of the pixels can be increased and the resolution of the display panel 300 can be increased.

In the present embodiment, there is no color conversion layer 160 between the white insulation layer 530 and the second substrate 120. In some other embodiments, there may be color conversion layer 160 between the white insulation layer 530 and the second substrate 120, and the another light that is transformed by the color conversion layer 160 may be absorbed by the first spacer layer 540 or be absorbed by the first spacer layer 540 after being reflected or scattered by the white insulation layer 530.

In the present embodiment, a projection of the white insulation layer 530 on the first substrate 110 is not overlapped with the first color region C1 and the third color region C3, that is the projection of the white insulation layer 530 on the first substrate 110 is within the second color region C2 and two black matrixes 114 at two sides of the second color region C2. In other words, as long as a width of the black matrix 114 is wide enough to cover the white insulation layer 530, leaking of the another light that is transformed after being reflected by the white insulation layer 530 may be avoid.

In the present embodiment, the filter layers 112 of the first color region C1 and the third color region C3 are red or green. The light of the first color region C1 and the third color region C3 that is transformed may be reflected toward the filter layers 112 by the white insulation layer 530 so as to increase the light emitting efficiency.

In the present embodiment, the white insulation layer 530 and the first spacer layer 540 of the display panel 300 may be sequentially formed, and the color conversion layer 160 may be subsequently formed. Therefore, there is an incline angle similar to that shown in FIG. 1 between the white insulation layer 530 and the first substrate 110.

Figure 18:
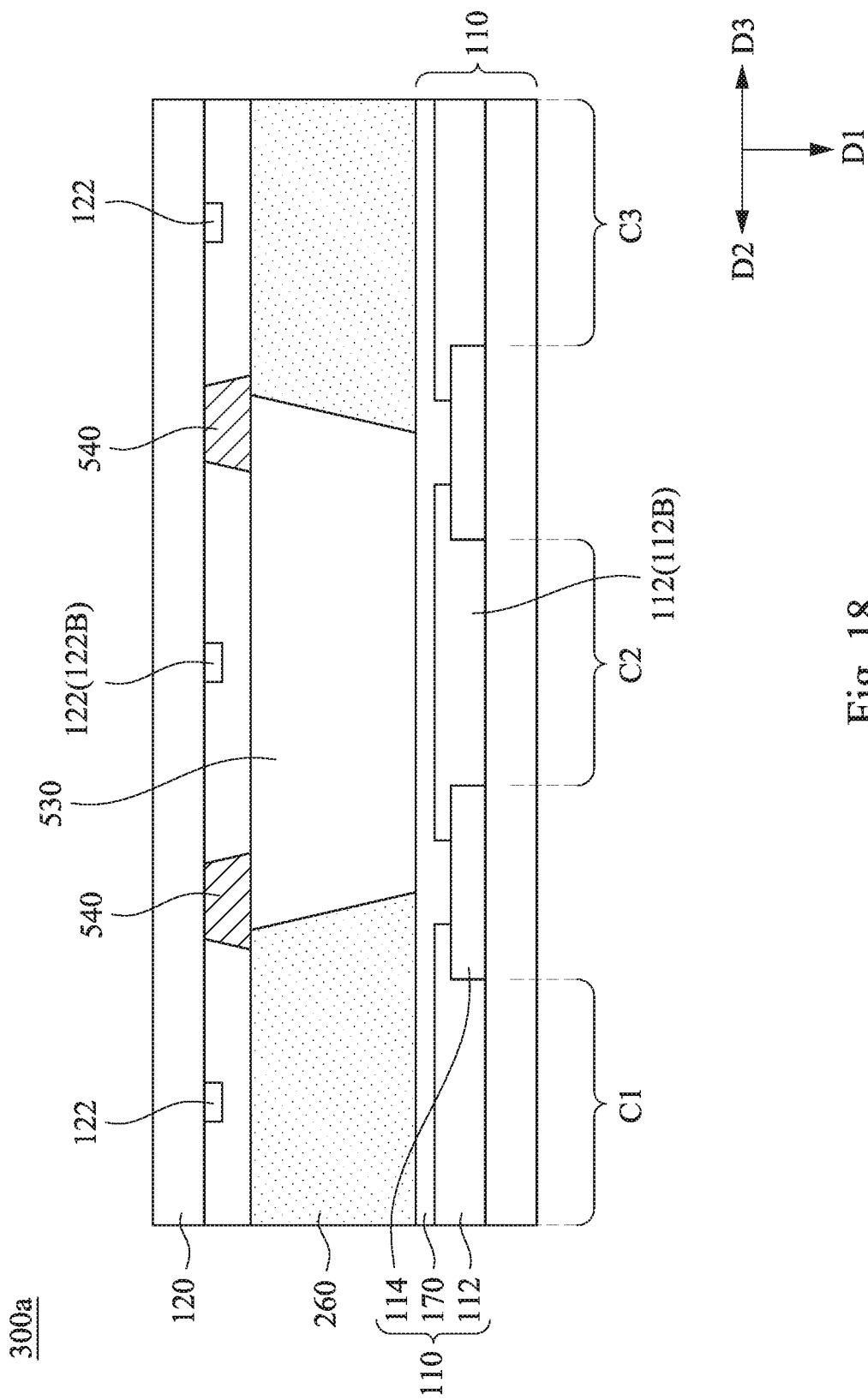

FIG. 18 is a cross-sectional view of a display panel 300a according to some embodiments of the present disclosure. The display panel 300a is similar to the display panel 300 shown in FIG. 17, and the difference is that the color conversion layer 260 of the display panel 300a may be formed by patterning first, and subsequently forming the white insulation layer 530 and the first spacer layer 540. Therefore, a side of the white insulation layer 530 close to the second substrate 120 of the display panel 300a is wider than a side of the white insulation layer 530 closer to the first substrate 110, and there is no color conversion layer 260 between the white insulation layer 530 and the second substrate 120. In addition, in some embodiments, the first spacer layer 540 may be partially overlapped with the color conversion layer 260. The configuration of the first color region C1 and the third color region C3 is the same as the display panel 300 shown in FIG. 17, the display panel 300a has similar advantages as the display panel 300 shown in FIG. 17, and the description is not repeated hereinafter.

In the embodiments shown above, by depositing the reflective layer between the first spacer layer and the second spacer layer, or adjacently depositing the reflective layer and the first spacer layer, or making the white insulation layer and the first spacer layer free from overlapping along the direction of arrangement of the sub-pixels, the width of the light shielding structure formed by these mentioned structures along the second direction D2 can be reduced. Therefore, the interval between adjacent two sub-pixels may be reduced such that the number of the pixels can be increased and the resolution of the display panel can be increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display panel, comprising:
   a first substrate having a filter layer;
   a second substrate opposite to the first substrate;
   at least one light-emitting diode disposed on the second substrate;
   at least one reflective layer located on the first substrate and protruding toward the second substrate, wherein a material of the reflective layer comprises metal, the reflective layer has a first section, a second section, and a third section connected with the first section and the second section, the second section is located between the first spacer layer and the first substrate, the third section is in contact with a sidewall of the first spacer layer, and the first end of the first spacer layer covers the first section; and
   at least one first spacer layer located between the first substrate and the second substrate, the first spacer layer has a first end and a second end, wherein the first end of the first spacer layer is located between a surface of the reflective layer adjacent to the second substrate and the second substrate.

2. The display panel of claim 1, wherein an edge of the first end of the first spacer layer is substantially aligned with an edge of the reflective layer adjacent to the first end along a direction perpendicular to the first substrate.

3. The display panel of claim 1, wherein an edge of the second end of the first spacer layer is substantially aligned with an edge of the reflective layer adjacent to the second end along a direction perpendicular to the first substrate.

4. The display panel of claim 1, further comprising:
   a second spacer layer located on the first substrate and protruding toward the second substrate, the third section of the reflective layer is in contact with a sidewall of the second spacer layer, and the first section of the reflective layer is located between the first spacer layer and the second spacer layer.

5. The display panel of claim 1, wherein the first substrate further comprises:
   a protection film covering the filter layer, wherein a material of the protection film comprises transparent conductive layer.

6. The display panel of claim 1, wherein the first substrate further comprises:
   a black matrix, wherein a projection of the reflective layer on the first substrate is within a projection of the black matrix on the first substrate.

7. The display panel of claim 1, further comprising:
   a color conversion layer located between the filter layer and the light-emitting diode.

8. The display panel of claim 1, wherein the light-emitting diode and the filter layer have the same color.

9. The display panel of claim 1, further comprising a plurality of color regions, wherein when viewed from a direction along the arrangement of the color regions, a number of the at least one first spacer layer is plural, a number of the at least one reflective layer is plural, and adjacent two of the first spacer layers are located between adjacent two of the reflective layers.

10. The display panel of claim 9, wherein a color conversion layer is located between the two first spacer layer.

11. The display panel of claim 1, wherein the first spacer layer comprises a light-absorbing photoresist material.

12. The display panel of claim 1, further comprising a plurality of light-emitting diodes respectively correspond to a first color region, a second color region, and a third color region, and wherein the first color region further comprises:
   a color conversion layer located between the first substrate and the second substrate, and the color conversion layer is overlapped with the filter layer along a direction substantially perpendicular to the first substrate.

* * * * *